(12) United States Patent
Yu et al.

(10) Patent No.: US 10,937,718 B2
(45) Date of Patent: Mar. 2, 2021

(54) PACKAGE STRUCTURES AND METHOD OF FORMING THE SAME

(71) Applicant: Taiwan Semiconductor Manufacturing Company, Ltd., Hsinchu (TW)

(72) Inventors: Chen-Hua Yu, Hsinchu (TW); Chih-Hua Chen, Zhubei (TW); Hao-Yi Tsai, Hsinchu (TW); Yu-Feng Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/882,360

(22) Filed: Jan. 29, 2018

(65) Prior Publication Data
US 2018/0166364 A1    Jun. 14, 2018

Related U.S. Application Data

(62) Division of application No. 14/858,955, filed on Sep. 18, 2015, now Pat. No. 9,881,850.

(51) Int. Cl.
*H01L 21/48* (2006.01)
*H01L 21/56* (2006.01)
(Continued)

(52) U.S. Cl.
CPC ........ *H01L 23/481* (2013.01); *H01L 21/4846* (2013.01); *H01L 21/76898* (2013.01); *H01L 23/13* (2013.01); *H01L 23/5385* (2013.01); *H01L 23/5389* (2013.01); *H01L 24/19* (2013.01); *H01L 24/20* (2013.01); *H01L 24/97* (2013.01); *H01L 35/34* (2013.01); *H01L 21/561* (2013.01); *H01L 21/568* (2013.01); *H01L 23/49811* (2013.01); *H01L 24/16* (2013.01); *H01L 24/32* (2013.01); *H01L 24/48* (2013.01); *H01L 24/73* (2013.01); *H01L 24/83* (2013.01); *H01L 24/92* (2013.01); *H01L 2224/0401* (2013.01); *H01L 2224/04042* (2013.01);
(Continued)

(58) Field of Classification Search
CPC .......... H01L 21/4846; H01L 21/76898; H01L 24/19; H01L 24/20; H01L 24/97
See application file for complete search history.

(56) References Cited

U.S. PATENT DOCUMENTS 6,150,724 A    11/2000  Wenzel et al.
8,361,842 B2   1/2013   Yu et al.
(Continued)

FOREIGN PATENT DOCUMENTS

CN    101872757 A    10/2010
CN    104716050 A    6/2015
(Continued)

*Primary Examiner* — Kenneth Parker
*Assistant Examiner* — Long H Le
(74) *Attorney, Agent, or Firm* — Slater Matsil, LLP

(57) ABSTRACT

Package structures and methods of forming package structures are described. A method includes placing a first package within a recess of a first substrate. The first package includes a first die. The method further includes attaching a first sensor to the first package and the first substrate. The first sensor is electrically coupled to the first package and the first substrate.

20 Claims, 38 Drawing Sheets

(51) Int. Cl.
*H01L 21/768* (2006.01)
*H01L 23/00* (2006.01)
*H01L 23/13* (2006.01)
*H01L 23/48* (2006.01)
*H01L 23/538* (2006.01)
*H01L 35/34* (2006.01)
*H01L 23/498* (2006.01)

(52) U.S. Cl.
CPC ............ *H01L 2224/04105* (2013.01); *H01L 2224/12105* (2013.01); *H01L 2224/16227* (2013.01); *H01L 2224/32225* (2013.01); *H01L 2224/48091* (2013.01); *H01L 2224/48227* (2013.01); *H01L 2224/73267* (2013.01); *H01L 2224/83005* (2013.01); *H01L 2224/83191* (2013.01); *H01L 2224/83192* (2013.01); *H01L 2224/92244* (2013.01); *H01L 2224/97* (2013.01); *H01L 2924/00014* (2013.01); *H01L 2924/14* (2013.01); *H01L 2924/1421* (2013.01); *H01L 2924/1431* (2013.01); *H01L 2924/1434* (2013.01); *H01L 2924/1436* (2013.01); *H01L 2924/1437* (2013.01); *H01L 2924/1461* (2013.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2008/0308928 A1 | 12/2008 | Chang et al. |
| 2009/0134481 A1* | 5/2009 | Sengupta ............ H01L 31/0203 257/415 |
| 2011/0057273 A1 | 3/2011 | O'Donnell et al. |
| 2011/0158273 A1 | 6/2011 | Okayama et al. |
| 2011/0193235 A1 | 8/2011 | Hu et al. |
| 2011/0291288 A1 | 12/2011 | Wu et al. |
| 2012/0007217 A1 | 1/2012 | Shim et al. |
| 2012/0017964 A1 | 1/2012 | Hussain et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0249042 A1 | 9/2013 | Shen et al. |
| 2013/0277865 A1* | 10/2013 | Teh .................. H01L 23/49838 257/782 |
| 2013/0285261 A1 | 10/2013 | Tan |
| 2013/0307140 A1 | 11/2013 | Huang et al. |
| 2014/0103488 A1 | 4/2014 | Chen et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264339 A1 | 9/2014 | Kim et al. |
| 2014/0264930 A1 | 9/2014 | Yu et al. |
| 2014/0353791 A1 | 12/2014 | Jain et al. |
| 2014/0367160 A1 | 12/2014 | Yu et al. |
| 2015/0166329 A1 | 6/2015 | Cheng et al. |
| 2015/0235936 A1* | 8/2015 | Yu ........................ H01L 24/97 257/738 |
| 2018/0123014 A1* | 5/2018 | Zoller .................... H01L 35/32 |

FOREIGN PATENT DOCUMENTS

| | | |
|---|---|---|
| CN | 104766903 A | 7/2015 |
| JP | 2006173279 A | 6/2006 |

\* cited by examiner

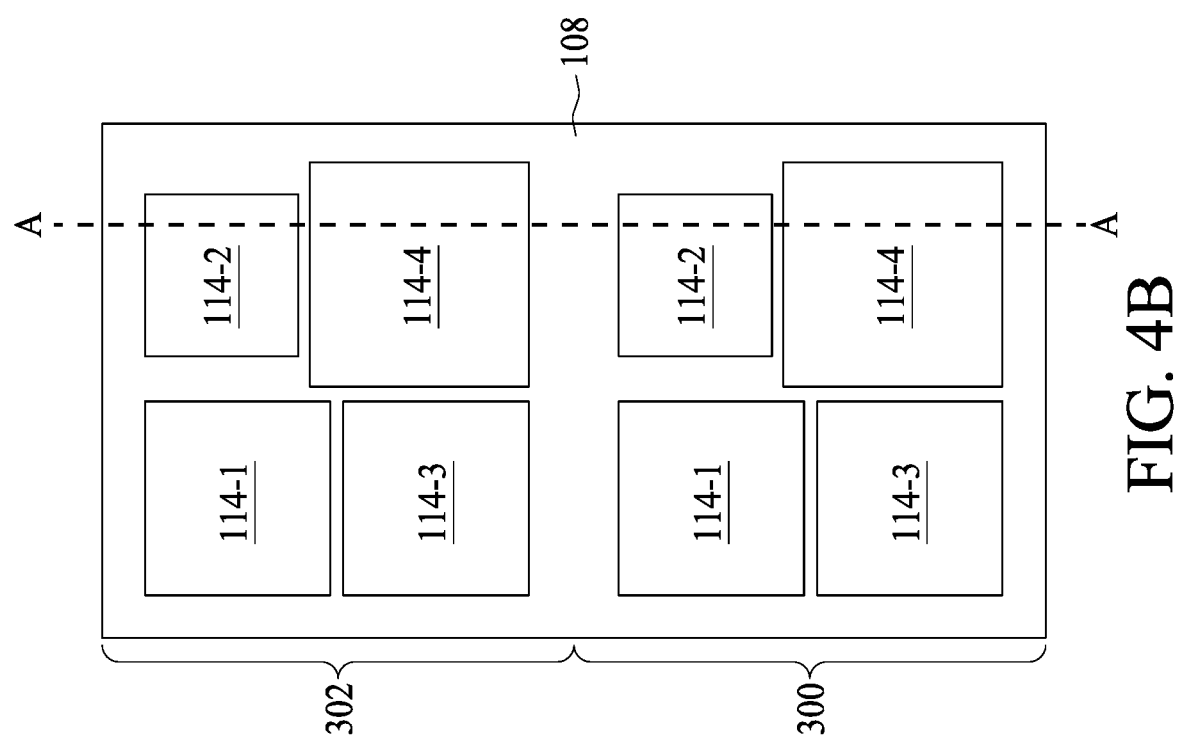

US 10,937,718 B2

PACKAGE STRUCTURES AND METHOD OF FORMING THE SAME

This application is a divisional of U.S. patent application Ser. No. 14/858,955, entitled "Package Structures and Method of Forming the Same," filed on Sep. 18, 2015, which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 3, 4A-B, 5 through 24, and 25A-B are views of intermediate steps during a process for forming a package structure in accordance with some embodiments.

DETAILED DESCRIPTION

Figure 1:
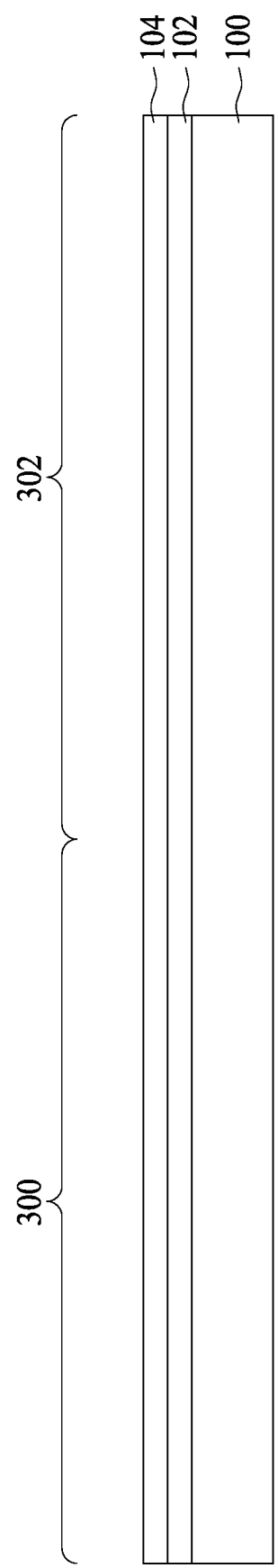

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure for a wearable device or structure. The package structures may include a fan-out or fan-in package. In particular, the package structures may be included in a wearable device such as e-textiles (sometimes referred to as smart clothing), a wearable computer, an activity tracker, a smartwatch, smart glasses, a GPS (global positioning system) device, medical devices, augmented reality device, virtual reality headset, smart-connected products, or the like. Further, the teachings of this disclosure are applicable to any package structure including one or more integrated circuit dies with one or more sensors. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 3, 4A-B, 5 through 24, and 25A-B illustrate views of intermediate steps during a process for forming a package structure in accordance with some embodiments. FIGS. 1 through 3, 4A, 5 through 24, and 25A are cross-sectional views with FIGS. 4B and 25B being top views. FIG. 1 illustrates a carrier substrate 100 and a release layer 102 formed on the carrier substrate 100. A first package region 300 and a second package region 302 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a Light-to-Heat-Conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of co-planarity.

Figure 2:
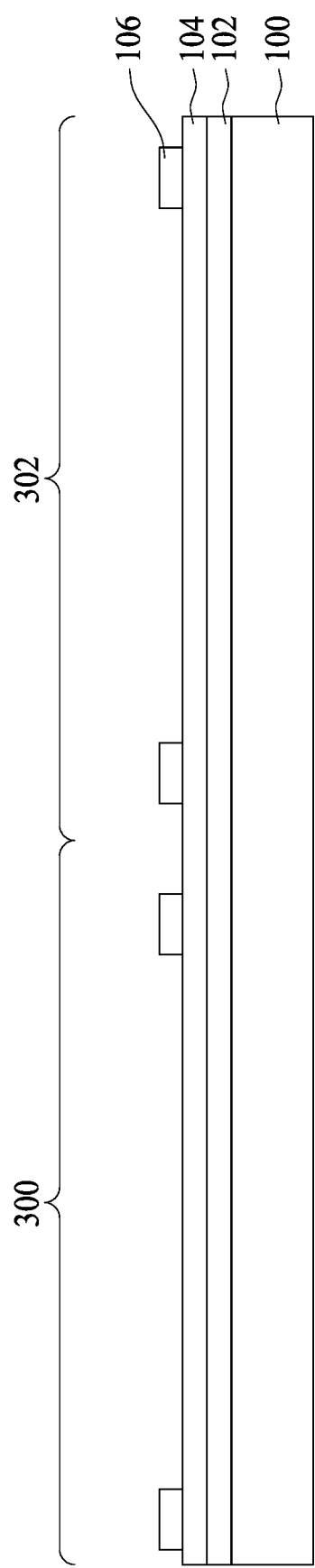

In FIG. 2, metallization patterns 106 are formed. As illustrated in FIG. 2, the dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
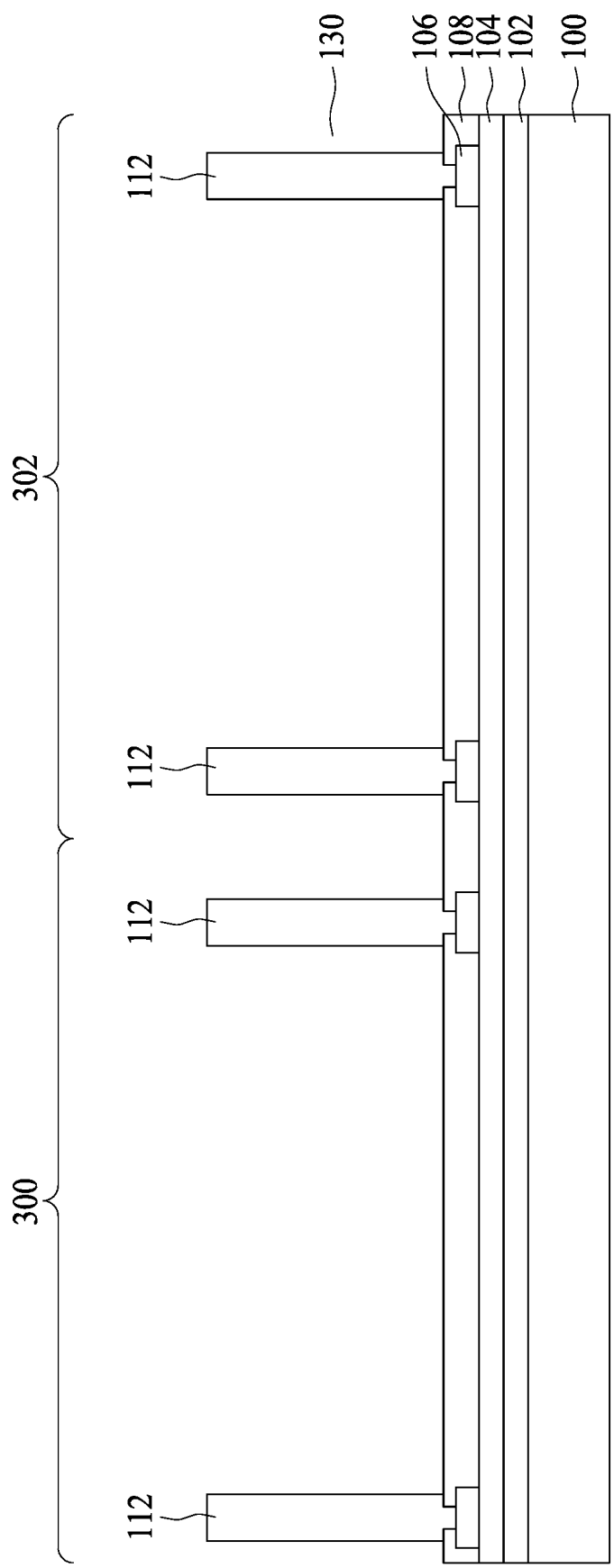

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back side redistribution structure. As illustrated, the back side redistribution structure includes the two dielectric layers 104 and 108 and one metallization pattern 106. In other embodiments, the back side redistribution structure can include any number of dielectric layers, metallization patterns, and vias. One or more additional metallization pattern and dielectric layer may be formed in the back side redistribution structure by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 3, through vias 112 are formed. As an example to form the through vias 112, a seed layer is formed over the back side redistribution structure, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 4A:
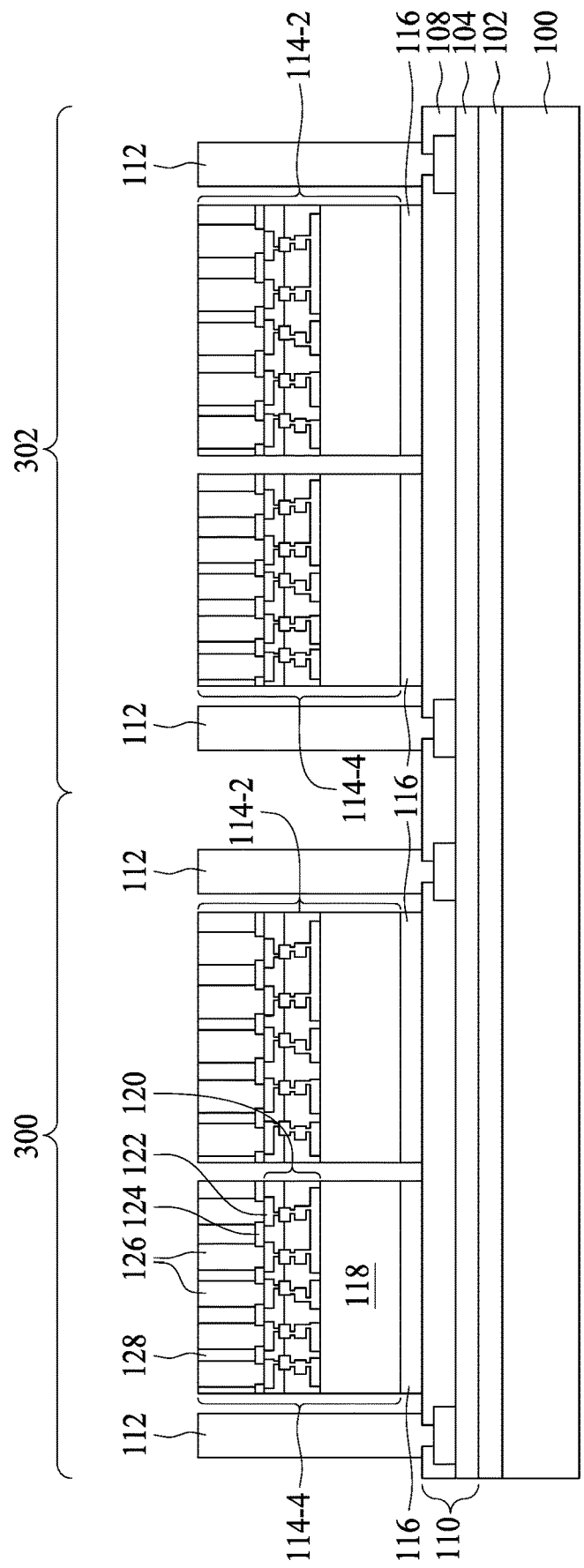

In FIGS. 4A and 4B, integrated circuit dies 114 are adhered to the dielectric layer 108 by an adhesive 116. FIG. 4B is a top view of the structure in FIG. 4A with the structure in FIG. 4A being along line A-A of FIG. 4B. As illustrated in FIG. 4B, four integrated circuit dies 114 (114-1, 114-2, 114-3, and 114-4) are adhered in each of the first package region 300 and the second package region 302, and in other embodiments, more or less integrated circuit dies may be adhered in each region. Also illustrated in FIG. 4B, the integrated circuit dies 114 may be different sizes, and in other embodiments, the integrated circuit dies 114 may be the same size.

Before being adhered to the dielectric layer 108, the integrated circuit dies 114 may be processed according to applicable manufacturing processes to form integrated circuits in the integrated circuit dies 114. For example, the integrated circuit dies 114 each comprise a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally co-terminus with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back sides of the integrated circuit dies 114 and adheres the integrated circuit dies 114 to the back side redistribution structure 110, such as the dielectric layer 108 in the illustration. The adhesive 116 may be any suitable adhesive, epoxy, die attach film (DAF), or the like. The adhesive 116 may be applied to a back side of the integrated circuit dies 114, such as to a back side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. As an example, an AFE is a set of analog signal conditioning circuitry that uses, for example, operational amplifiers, filters, and/or application-specific integrated circuits for sensors and other circuits to provide a configurable and flexible electronics functional block to interface a variety of sensors to an analog to digital converter or in some cases to a microcontroller. For example, in an embodiment, the integrated circuit die 114-1 is an AFE die, the integrated circuit die 114-2 is an AFE die is a PMIC die, the integrated circuit die 114-3 is a signal processing die, and the integrated circuit die 114-4 is a microcontroller (MCU) die.

Figure 5:
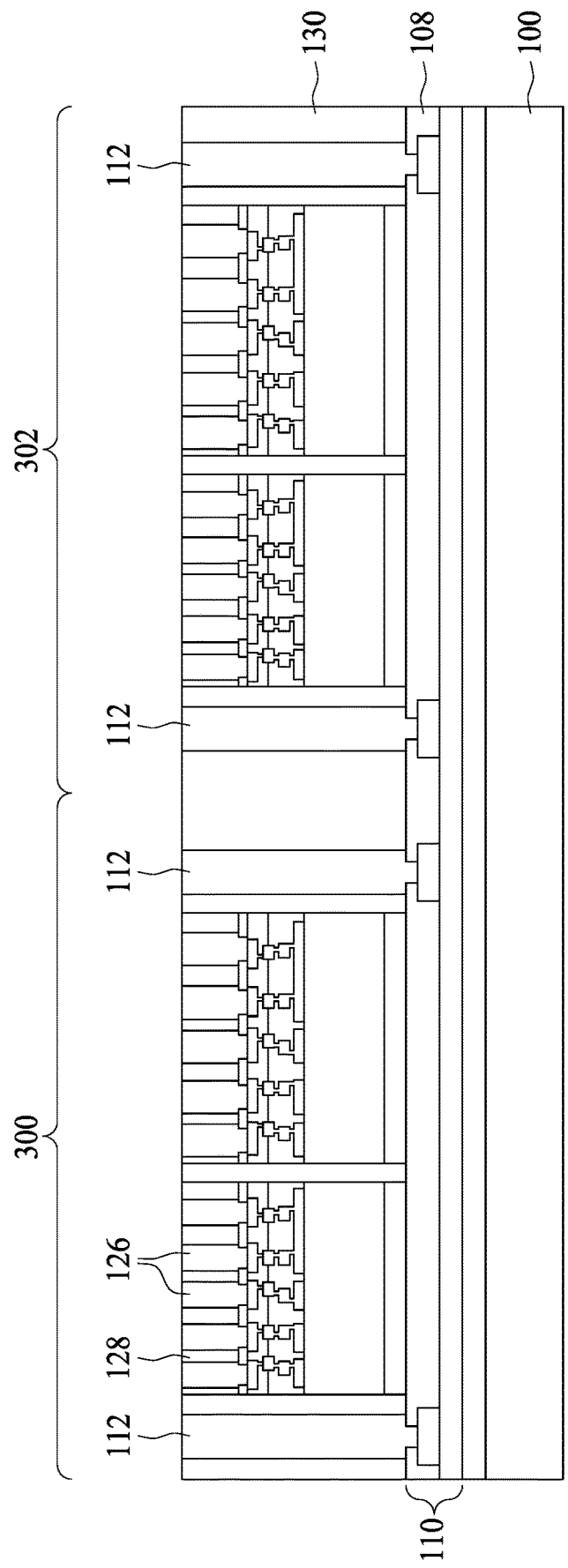

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are co-planar after the grinding process. In some embodiments, the grinding may be omitted, for example, if through vias 112 and die connectors 126 are already exposed.

In FIGS. 6 through 16, a front side redistribution structure 160 is formed. As will be illustrated in FIG. 16, the front side redistribution structure 160 includes dielectric layers 132, 140, 148, and 156 and metallization patterns 138, 146, and 154.

Figure 6:
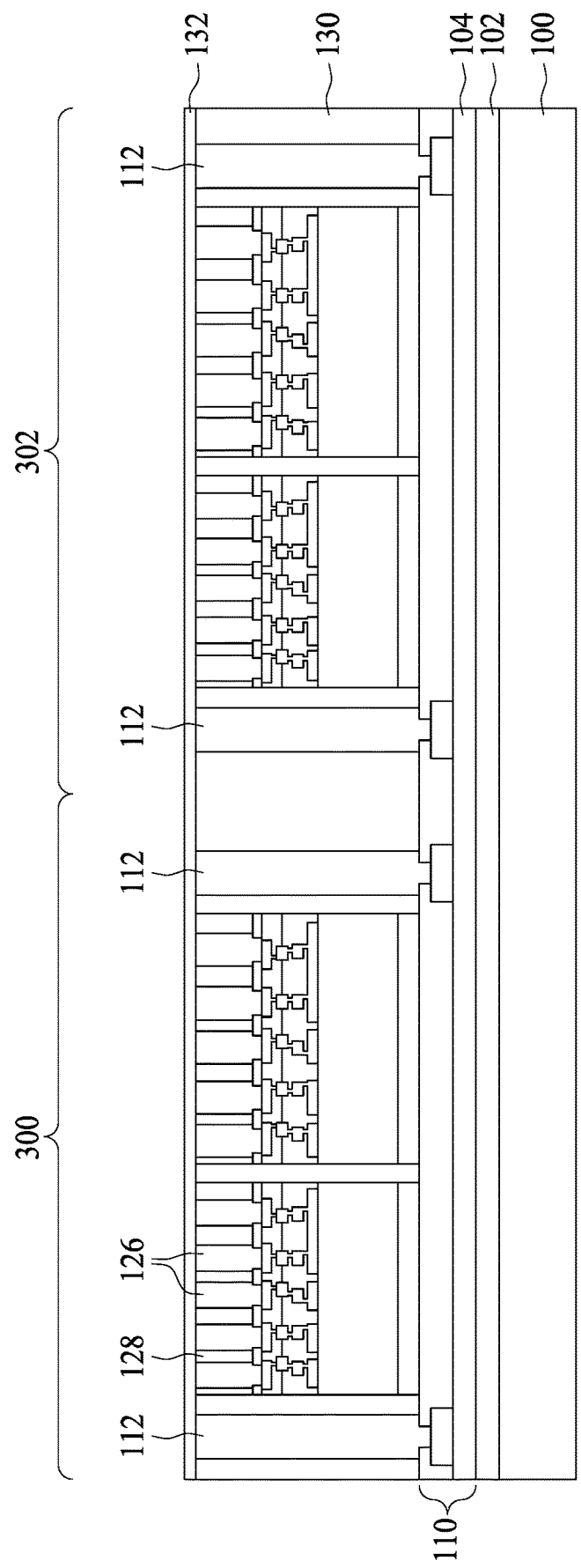

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
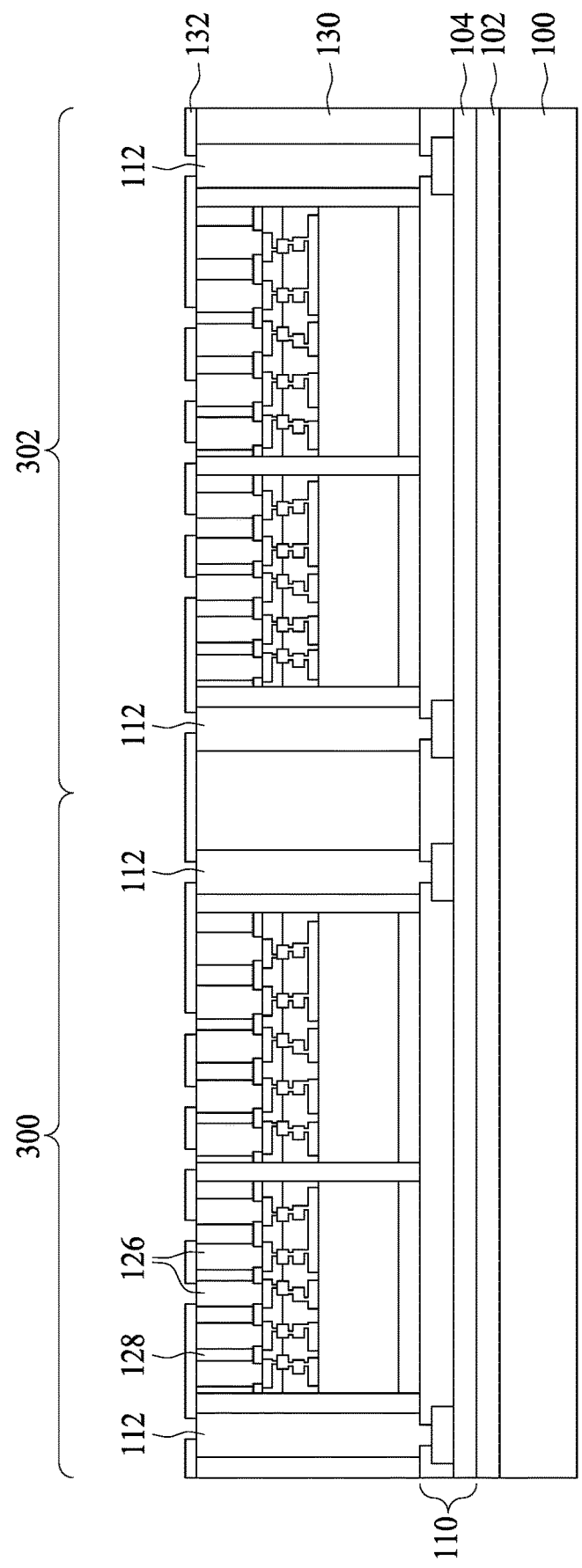

In FIG. 7, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 8:
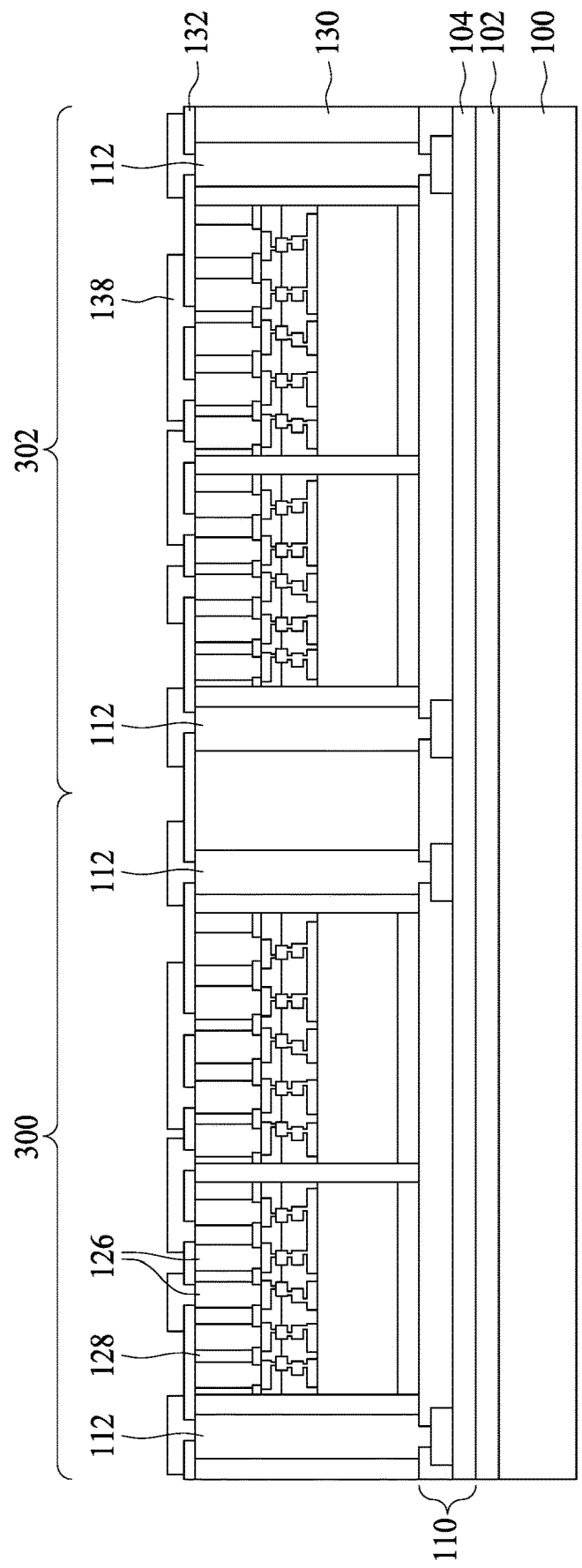

In FIG. 8, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

Figure 9:
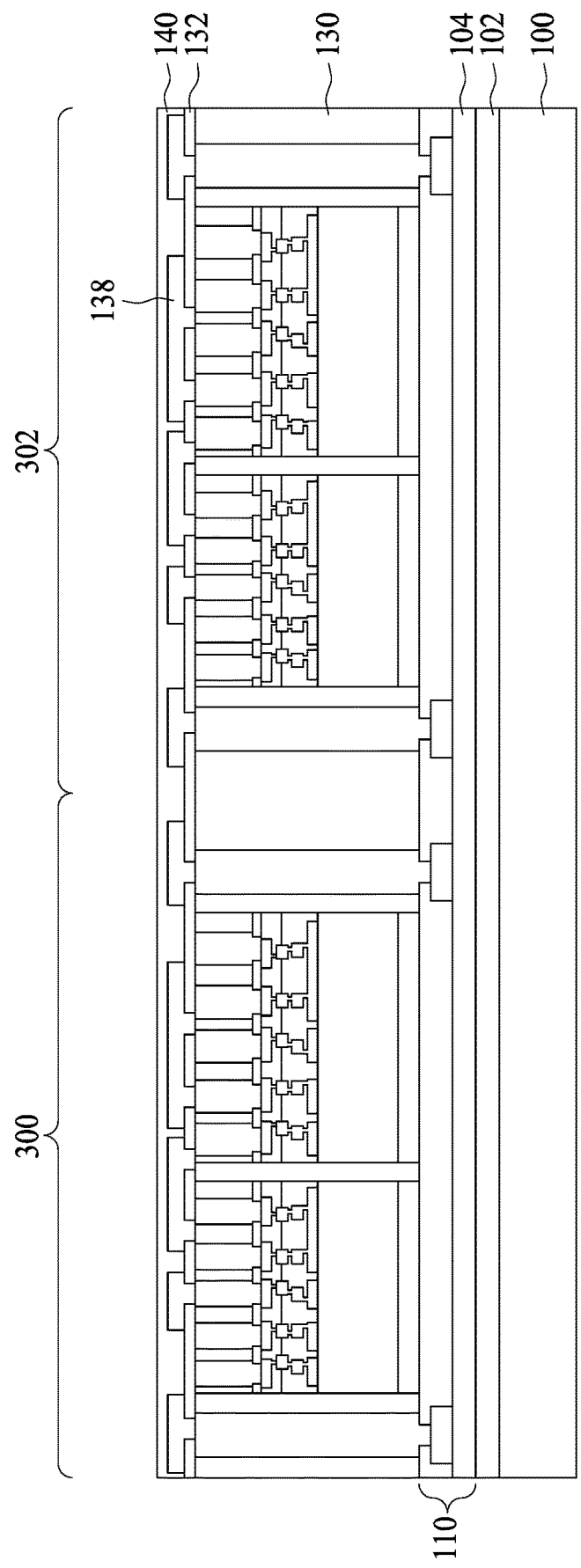

In FIG. 9, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 10:
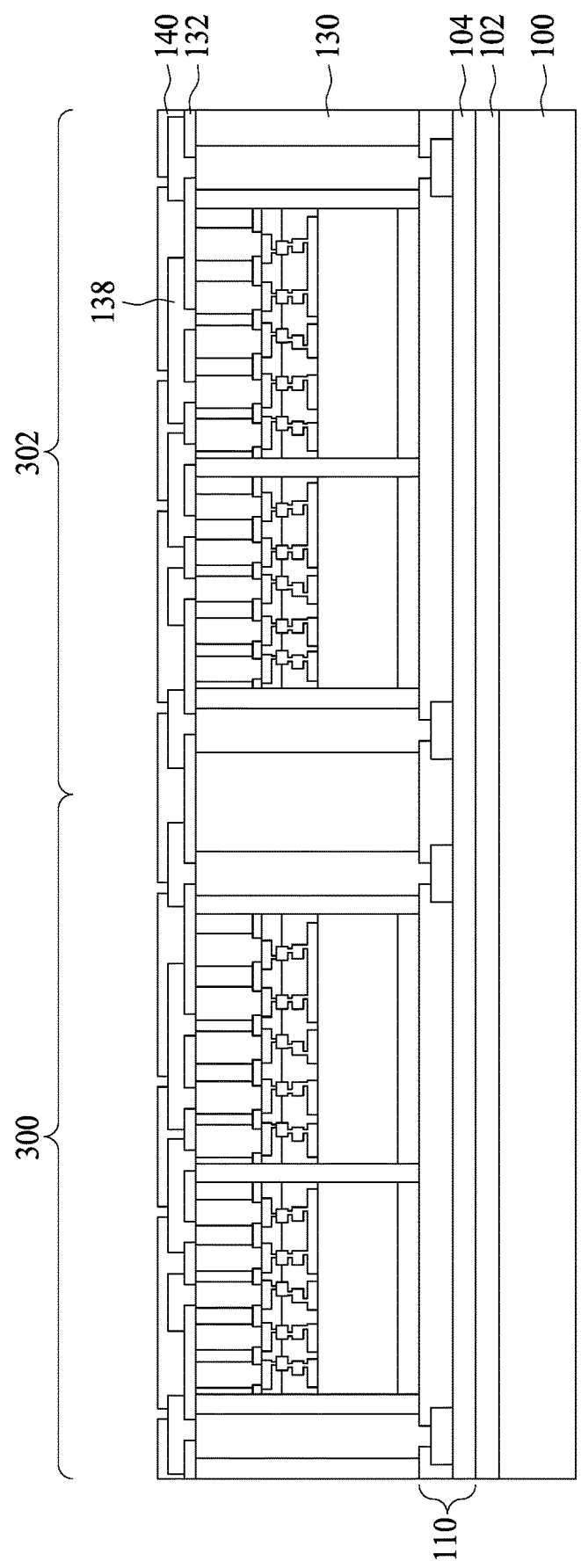

In FIG. 10, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 11:
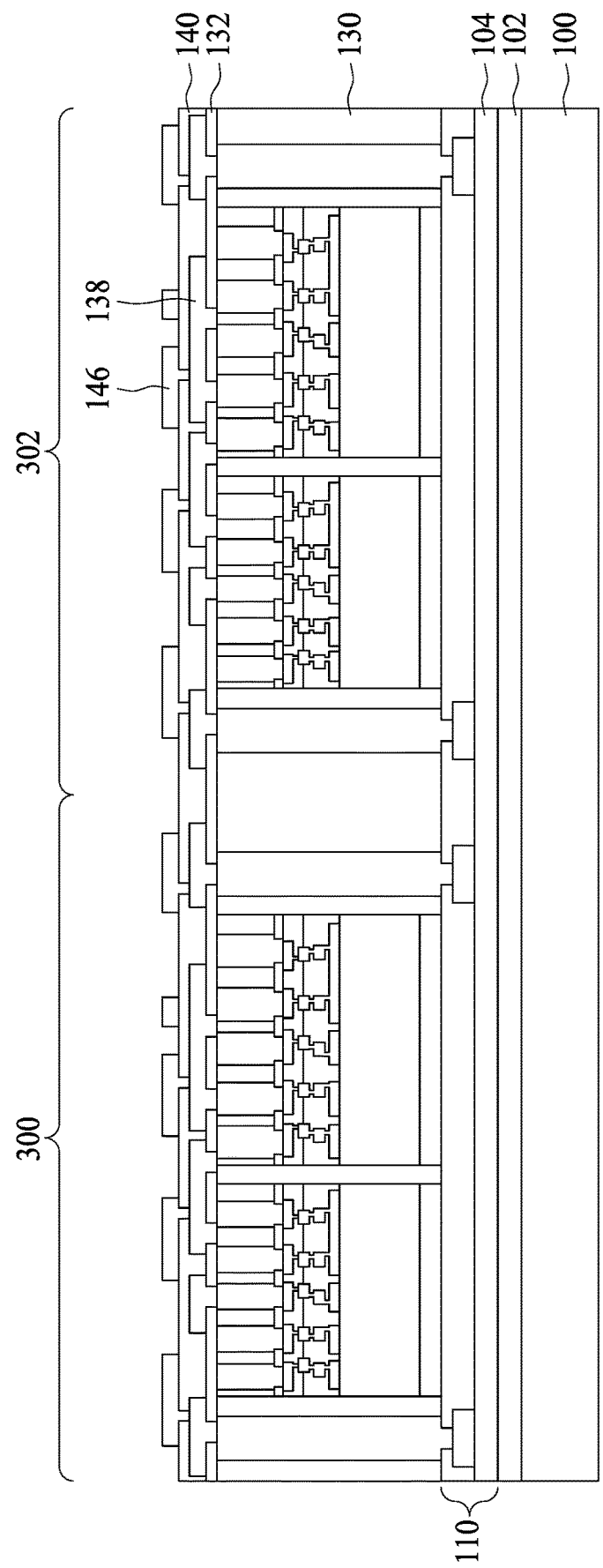

In FIG. 11, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 12:
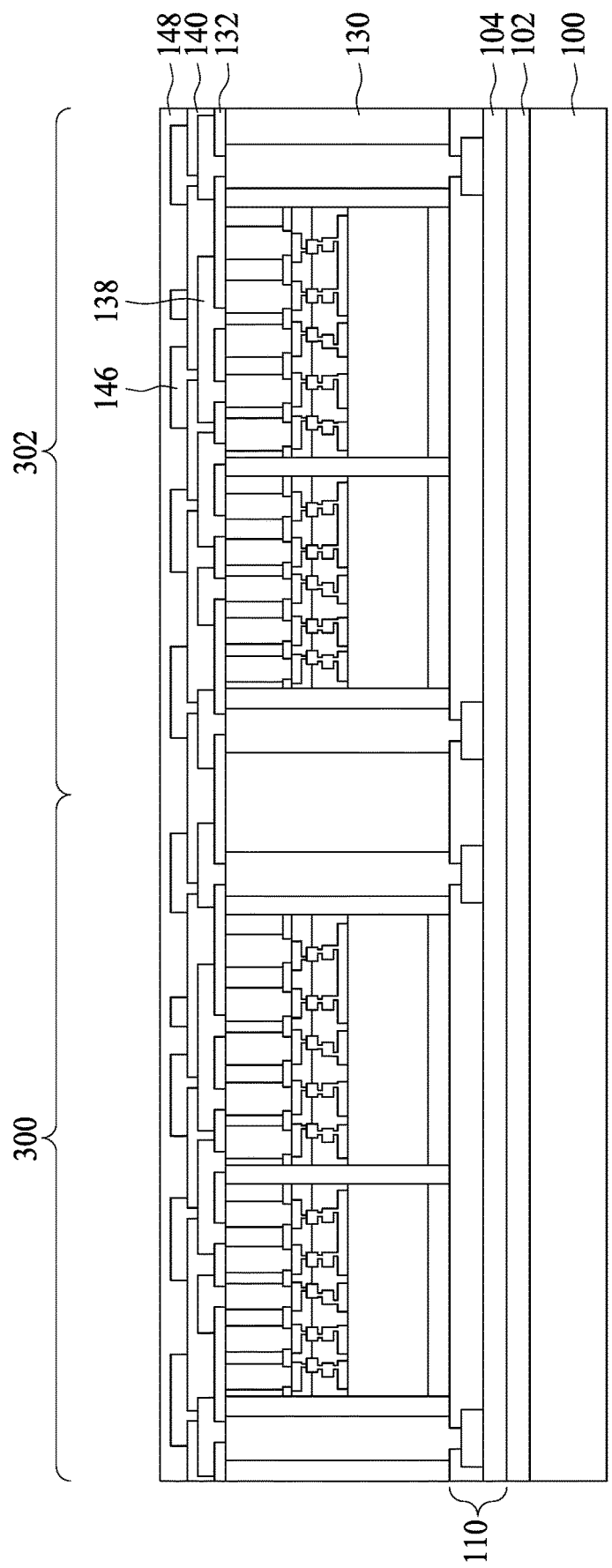

In FIG. 12, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof.

Figure 13:
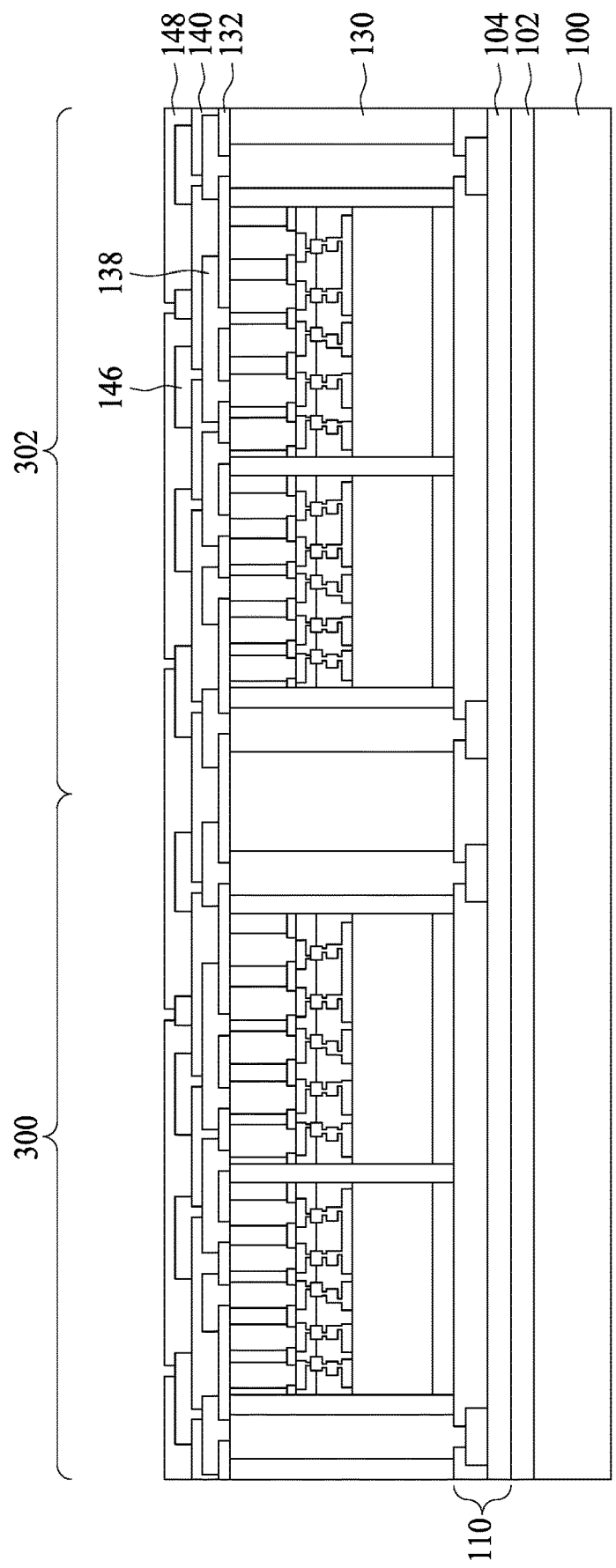

In FIG. 13, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 14:
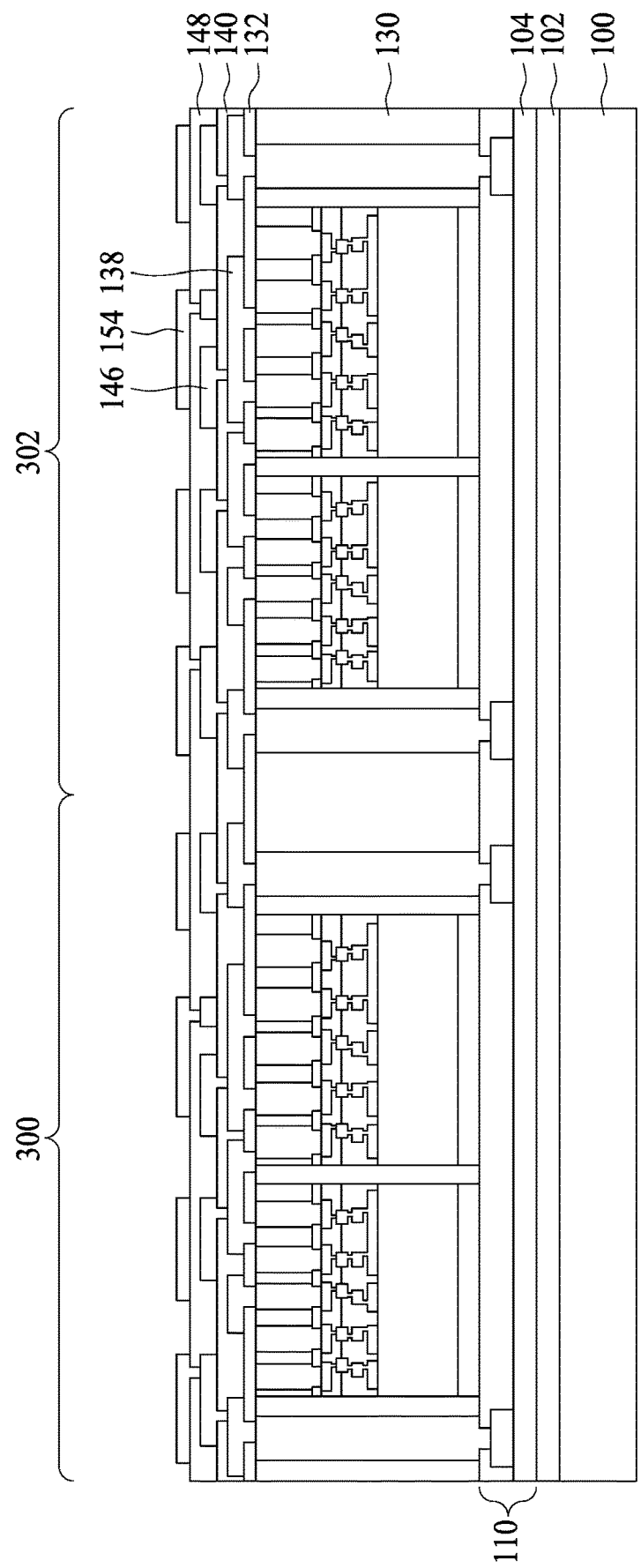

In FIG. 14, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 15:
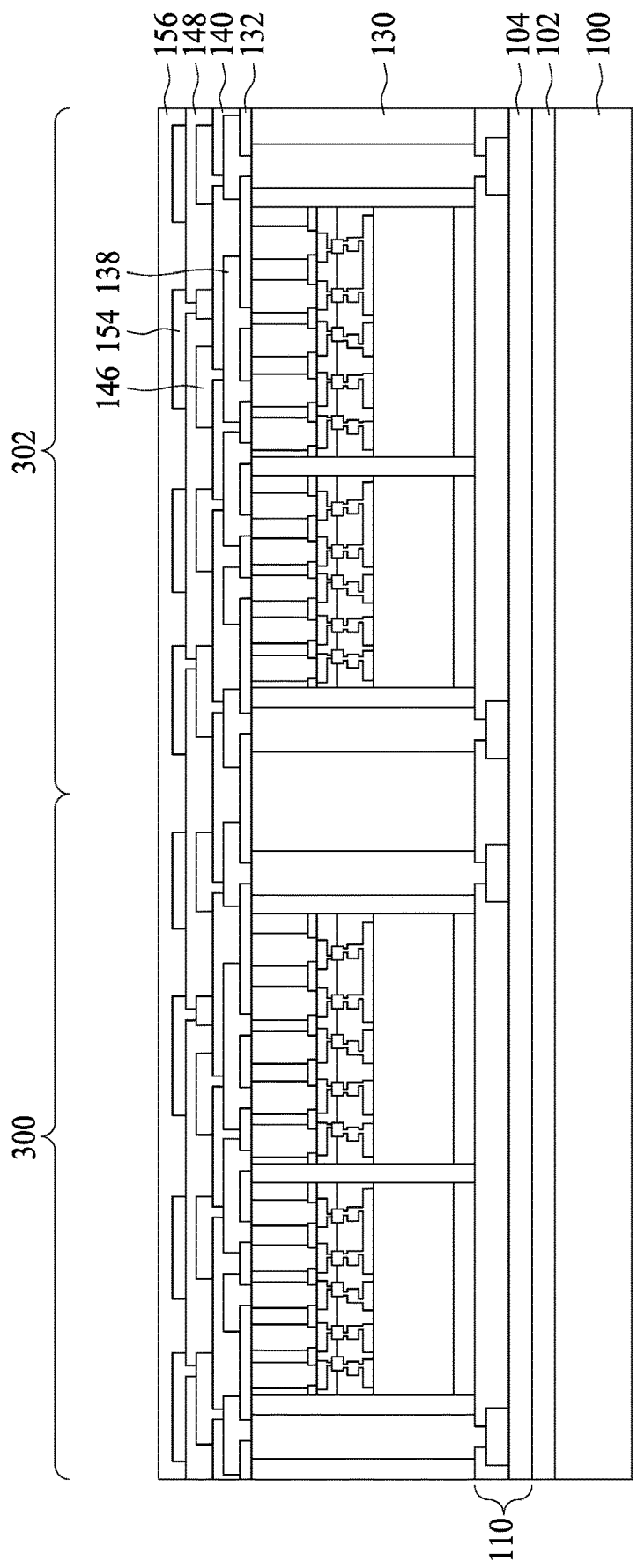

In FIG. 15, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

Figure 16:
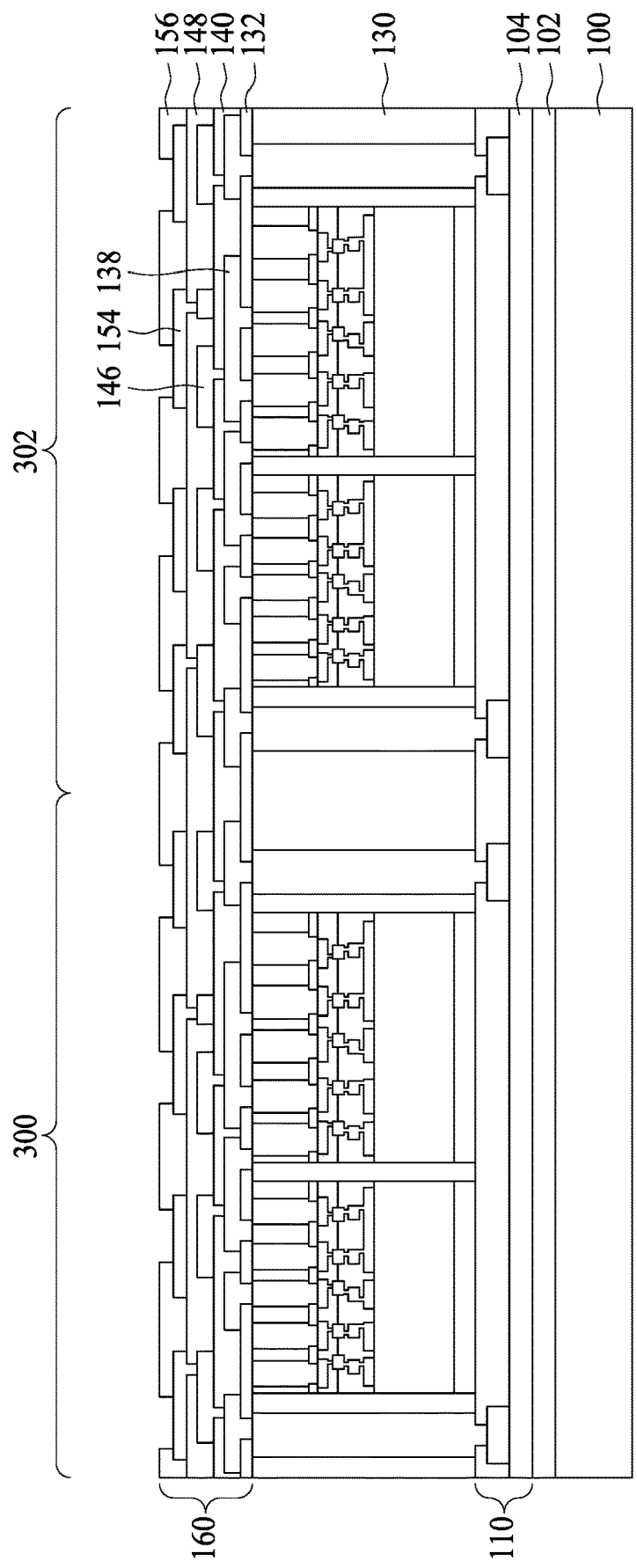

In FIG. 16, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front side redistribution structure 160 is shown as an example. More or fewer dielectric layers and metallization patterns may be formed in the front side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 17:
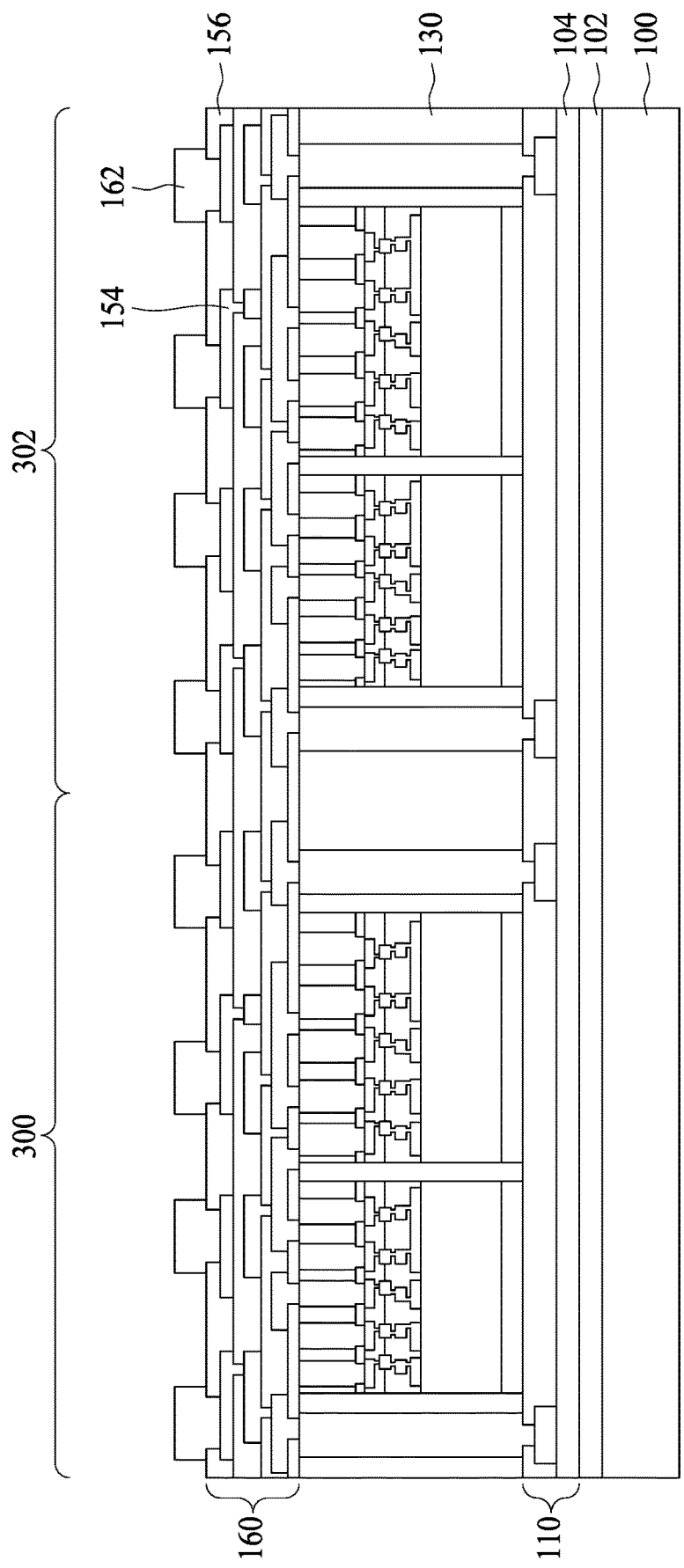

In FIG. 17, pads 162, which may be referred to as under bump metallurgies (UBMs), are formed on an exterior side of the front side redistribution structure 160. In the illustrated embodiment, pads 162 are formed through openings through the dielectric layer 156 to the metallization pattern

154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162.

Figure 18:
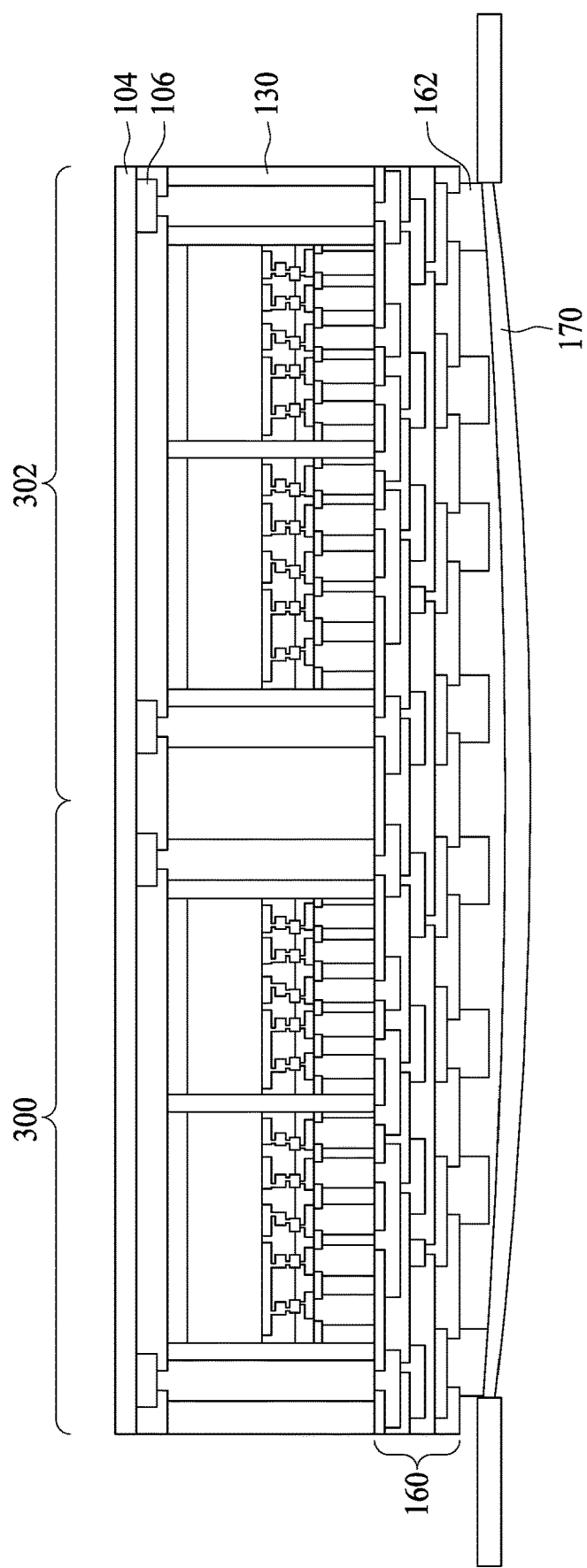

In FIG. 18, a carrier substrate de-bonding is performed to detach (de-bond) the carrier substrate 100 from the back side redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 170.

Figure 19:
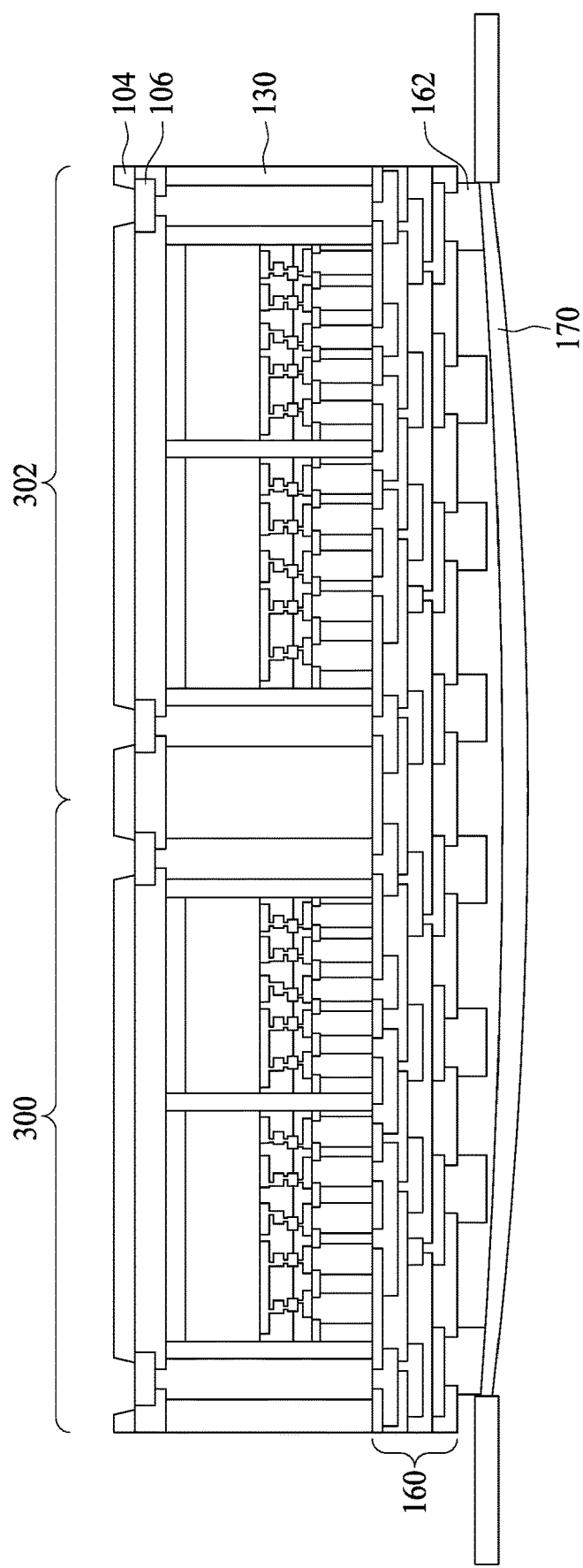

In FIG. 19, openings are formed through the dielectric layer 104 to expose portions of the metallization pattern 106. The openings may be formed, for example, using laser drilling, etching, or the like.

Figure 20:
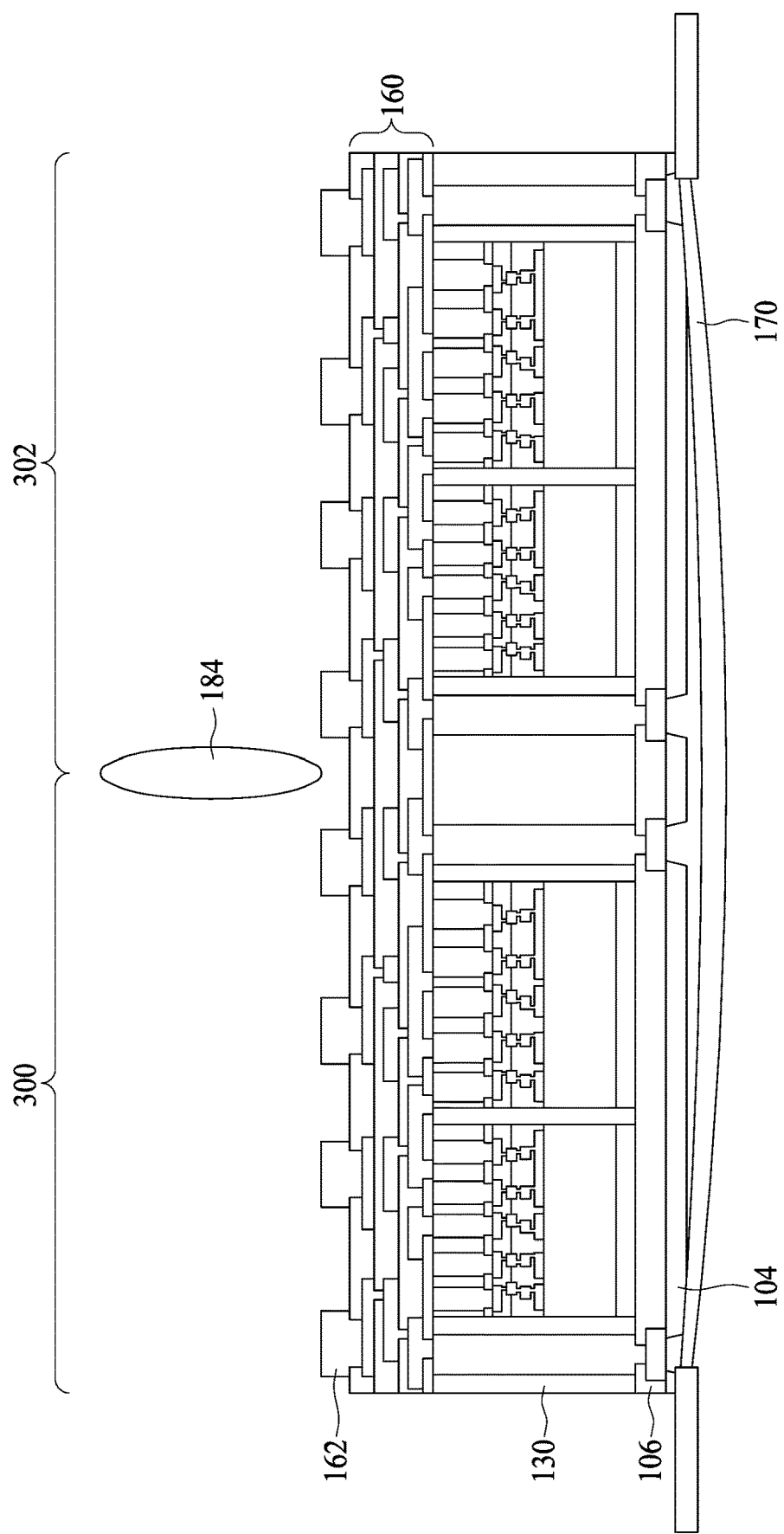
Figure 21:
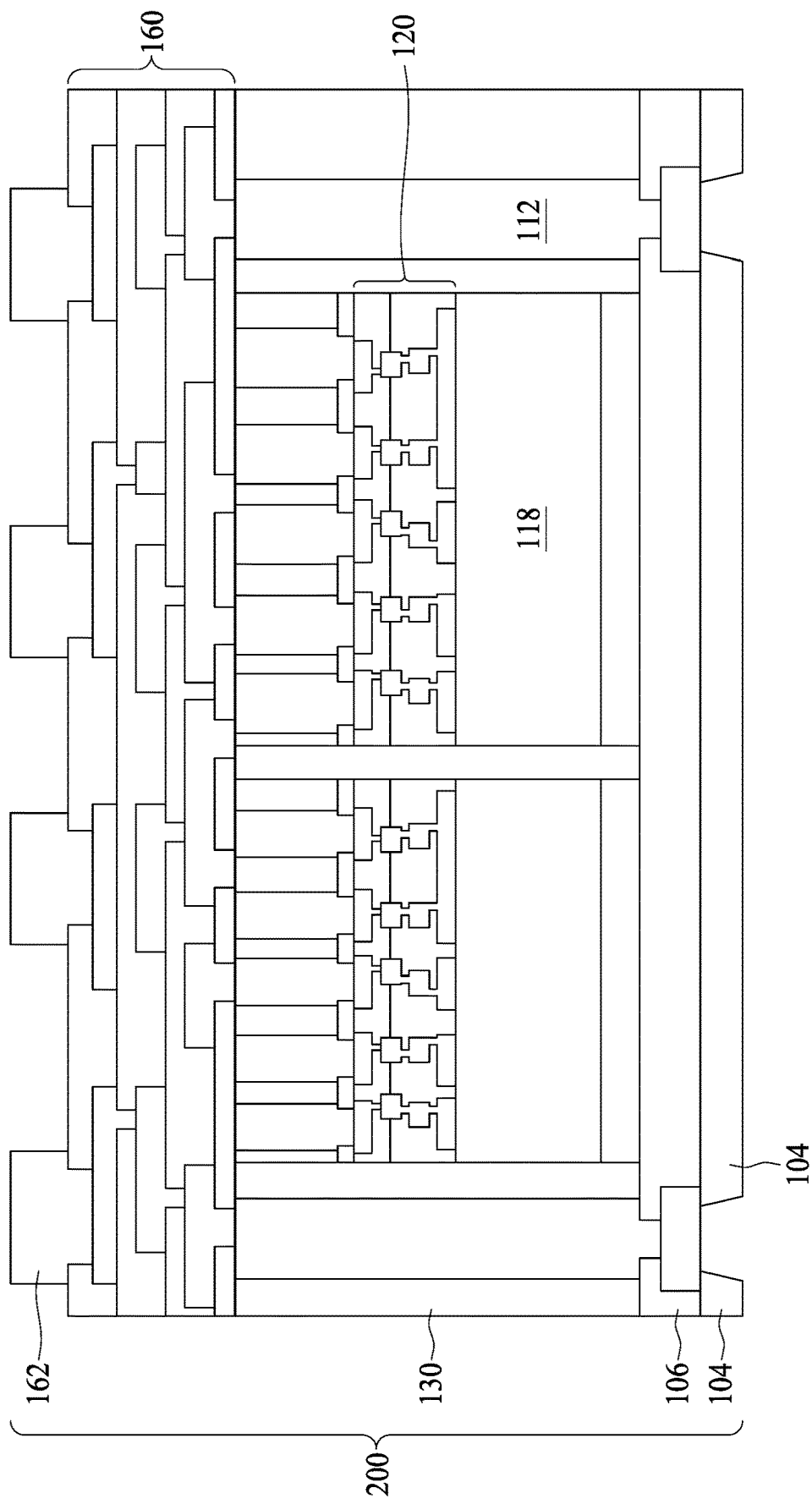

In FIG. 20, a singulation process is performed by sawing 184 along scribe line regions e.g., between adjacent regions 300 and 302. The sawing 184 singulates the first package region 300 from the second package region 302. FIG. 21 illustrates a resulting, singulated structure. The singulation results in package 200, which may be from one of the first package region 300 or the second package region 302, being singulated. The package 200 may also be referred to as an integrated fan-out (InFO) package 200.

Figure 22:
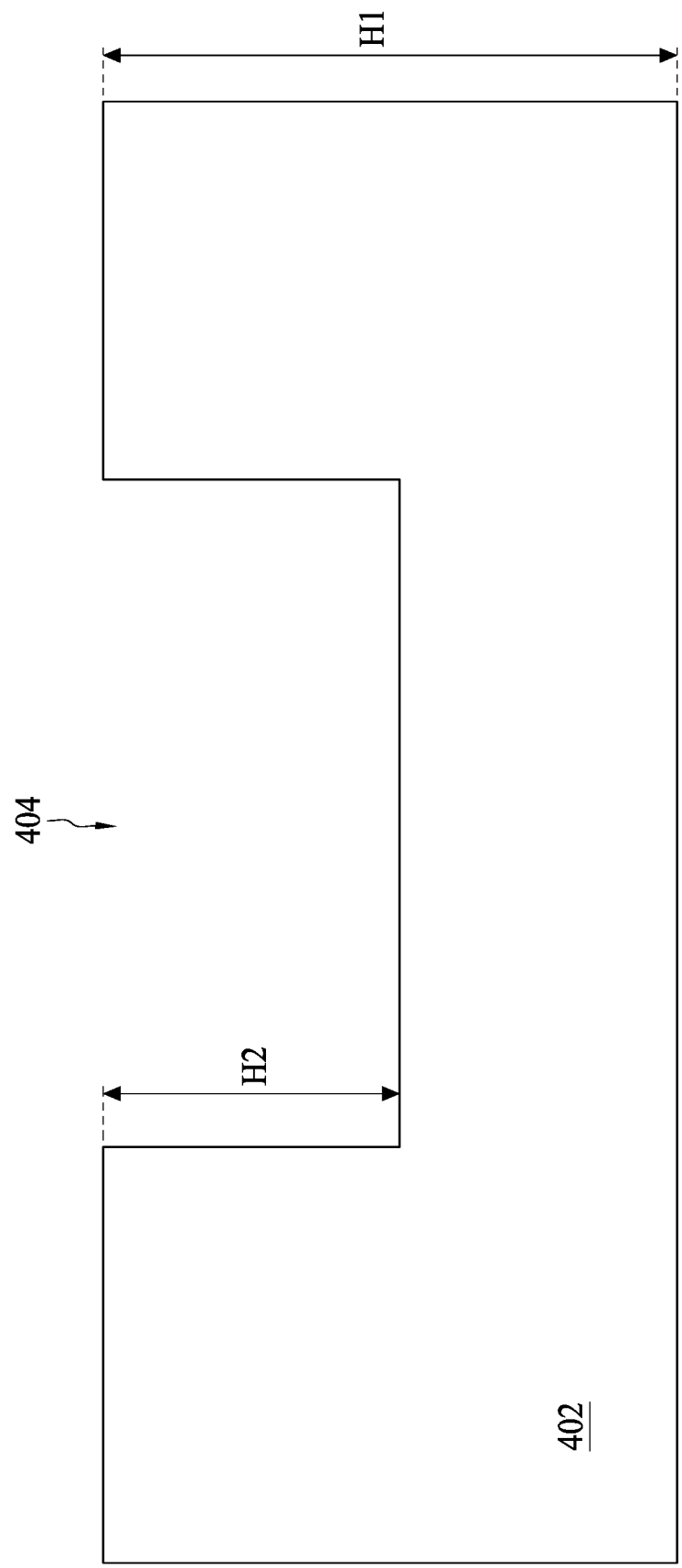

In FIG. 22, a substrate 402 is illustrated with a recess 404 over at least a portion of the substrate 402. The substrate 402 may be a semiconductor substrate, such as silicon, doped or undoped, or an active layer of an SOI substrate. The substrate 402 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 402 is, in some embodiments, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 402. The substrate 402 may be referred to as a package substrate 402.

The substrate 402 may include active and passive devices (not shown in FIG. 22). As one of ordinary skill in the art will recognize, a wide variety of devices such as transistors, capacitors, resistors, combinations of these, and the like may be used to generate the structural and functional requirements of the design for the package. The devices may be formed using any suitable methods.

The substrate 402 may also include metallization layers and vias (not shown). The metallization layers and vias may be formed over the active and passive devices and are designed to connect the various devices to form functional circuitry. The metallization layers may be formed of alternating layers of dielectric (e.g., low-k dielectric material) and conductive material (e.g., copper) with the vias interconnecting the layers of conductive material and may be formed through any suitable process (such as deposition, damascene, dual damascene, or the like). In some embodiments, the substrate 402 is substantially free of active and passive devices.

The recess 404 may be formed by patterning the substrate 402 the substrate 402. The patterning may be performed by, for example, an etch process. In some embodiments, the substrate has a thickness H1 with the recess having a depth H2 which is less than the thickness H1. In some embodiments, the depth H2 is in a range from about 10% to about 50% of the thickness H1, such as about 30% of the thickness H1.

Figure 23:
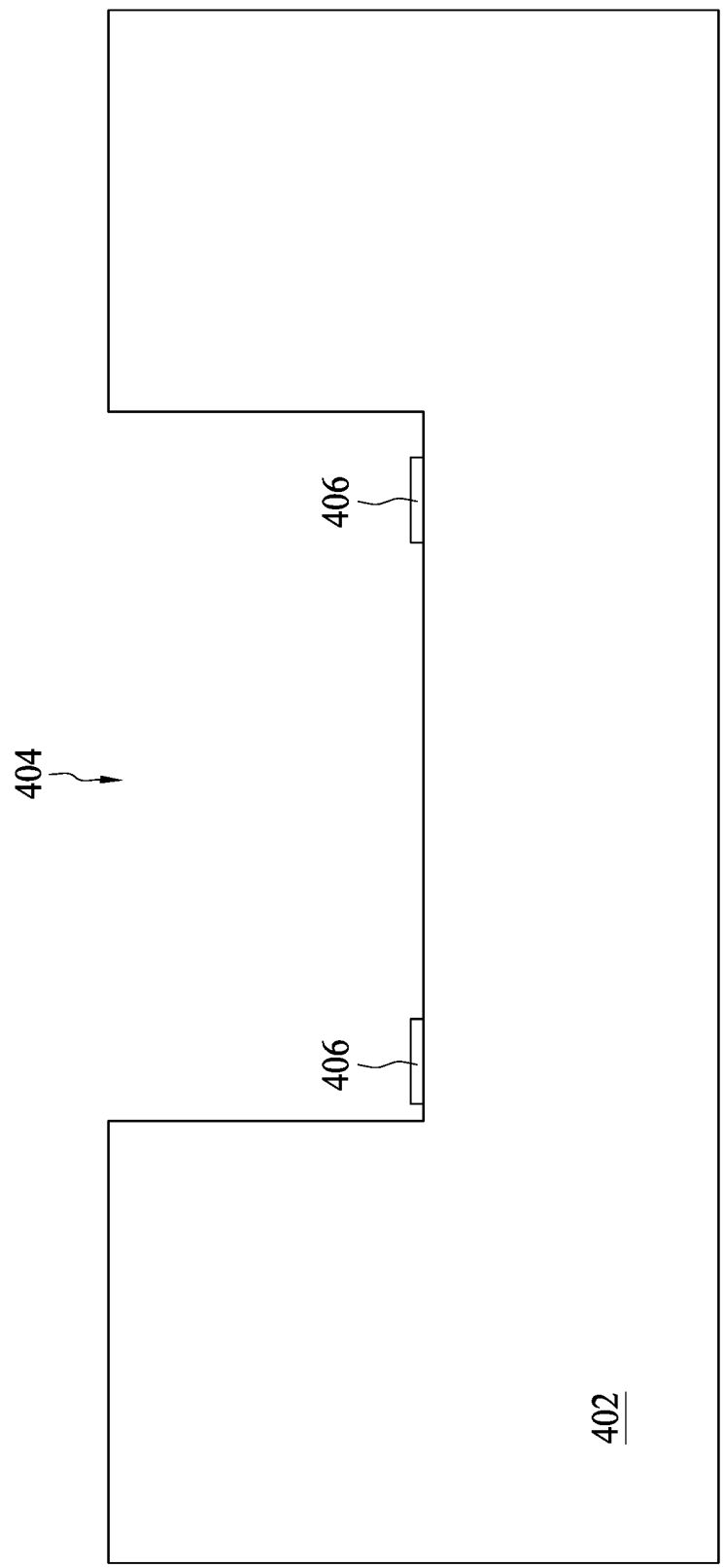

In FIG. 23, contact areas 406 are formed on the substrate 402 in the recess 404. In the illustrated embodiment, the contact areas 406 are formed on a bottom of the recess 404. In some embodiments, the contact areas 406 are bond pads. The bond pads 406 may be formed over the substrate 402. In some embodiments, the bond pads 406 are formed by forming recesses (not shown) into a dielectric layer (not shown) in the recess 404 of the substrate 402. The recesses may be formed to allow the bond pads 406 to be embedded into the dielectric layer. In other embodiments, the recesses are omitted as the bond pads 406 may be formed over the dielectric layer. The bond pads 406 electrically and/or physically couple the substrate 402, including metallization layers in the substrate 402, to the subsequently bonded second package 200 (see FIG. 24). In some embodiments, the bond pads 406 include a thin seed layer (not shown) made of copper, titanium, nickel, gold, tin, the like, or a combination thereof. The conductive material of the bond pads 406 may be deposited over the thin seed layer. The conductive material may be formed by an electro-chemical plating process, CVD, ALD, PVD, the like, or a combination thereof. In an embodiment, the conductive material of the bond pads 406 is copper, tungsten, aluminum, silver, gold, tin, the like, or a combination thereof.

Figure 24:
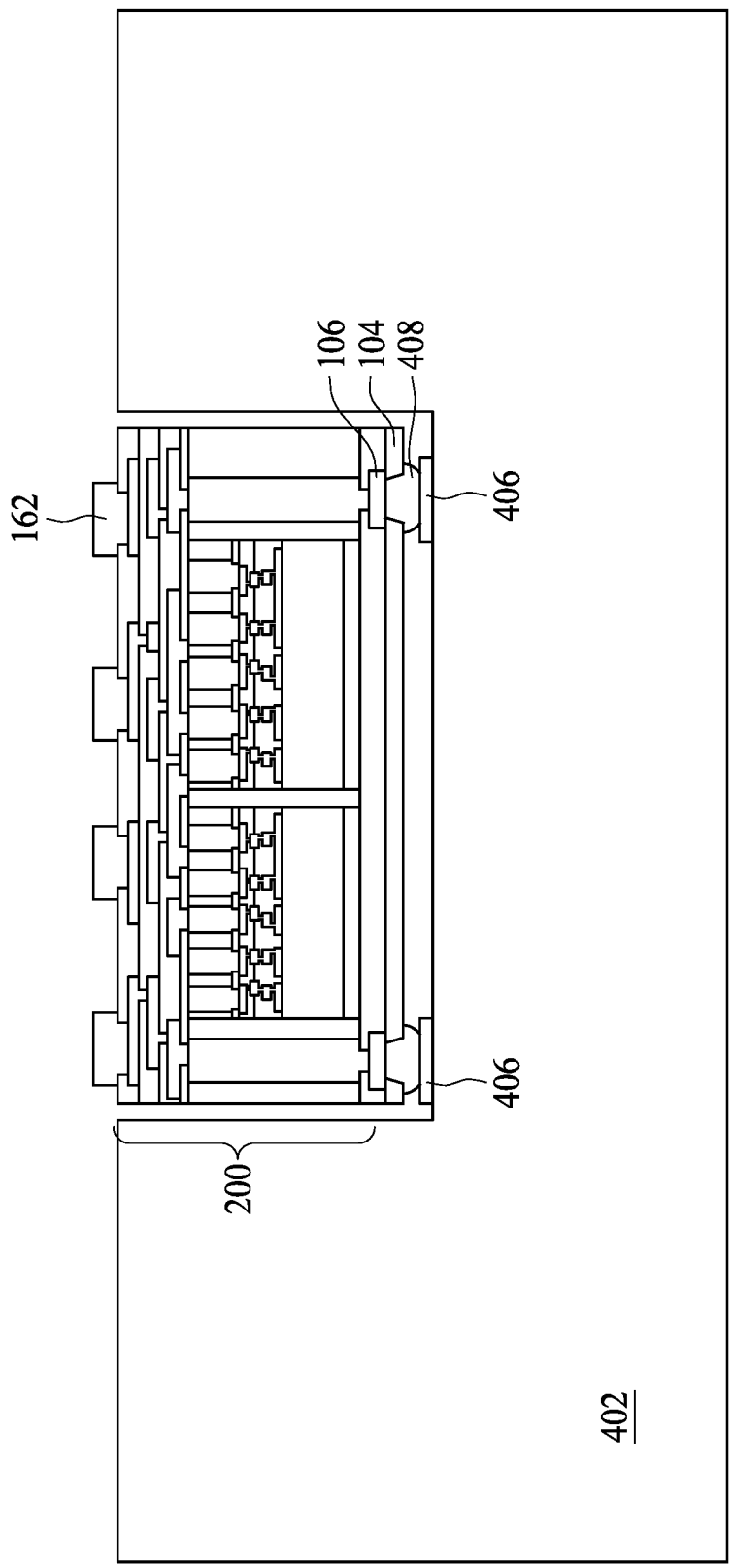

In FIG. 24, the package 200 is placed within the recess 404 of the substrate 402 such that the package 200 is coupled to the bond pads 406 with conductive connectors 408. In some embodiments, the package 200 is placed within the recess 404 with, for example, a pick-and-place tool. In an embodiment, the surface of the package 200 including the pads 162 may be level with the surface of substrate 402. In some embodiments, the surface of the package 200 including the pads 162 may be above or below the surface of substrate 402.

The conductive connectors 408 may be solder balls, metal pillars, controlled collapse chip connection (C4) bumps, micro bumps, electroless nickel-electroless palladium-immersion gold technique (ENEPIG) formed bumps, or the like. The conductive connectors 408 may include a conductive material such as solder, copper, aluminum, gold, nickel, silver, palladium, tin, the like, or a combination thereof. In an embodiment in which the conductive connectors 408 are solder bumps, the conductive connectors 408 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 408 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 408. The metal cap layer may include nickel, tin, tin-lead, gold, silver, palladium, indium, nickel-palladium-gold, nickel-gold, the like, or a combination thereof and may be formed by a plating process.

In some embodiments, the conductive connectors 408 can be reflowed to attach the package 200 to the bond pads 406. The conductive connectors 408 electrically and/or physically couple the substrate 402, including metallization layers in the substrate 402, to the second package 200. The conductive connectors 408 allow for the sensors 420 and the package 200 to be electrically coupled with the substrate 402.

The conductive connectors 408 may have an epoxy flux (not shown) formed thereon before they are reflowed with at least some of the epoxy portion of the epoxy flux remaining after the package 200 is attached to the substrate 402. This remaining epoxy portion may act as an underfill to reduce stress and protect the joints resulting from the reflowing the conductive connectors 408. In some embodiments, an underfill (not shown) may be formed between the package 200 and the substrate 402 in the recess 404 and surrounding the conductive connectors 408. The underfill may be formed by a capillary flow process after the package 200 is attached or may be formed by a suitable deposition method before the package 200 is attached.

Figure 25A:
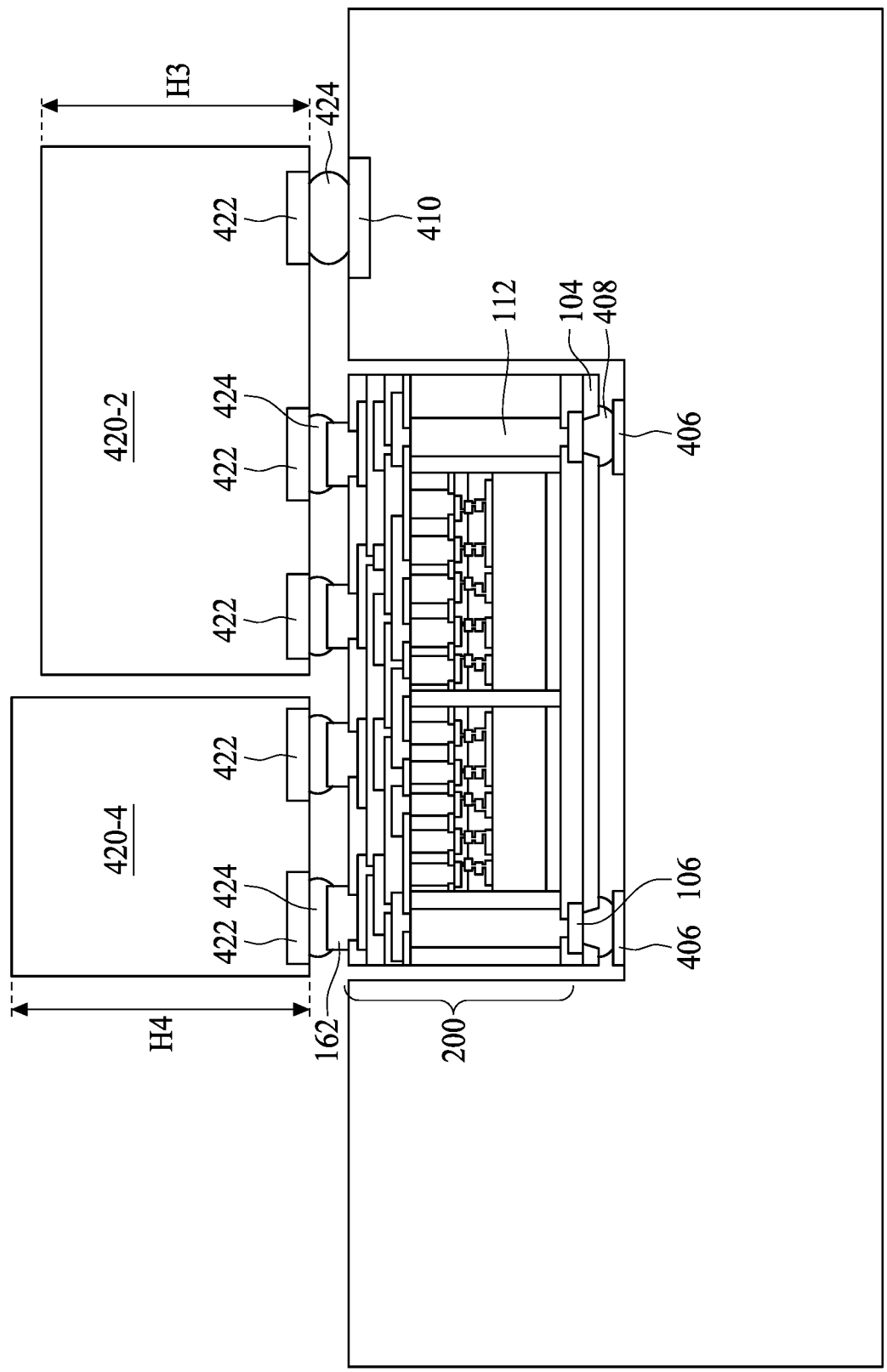
Figure 25B:
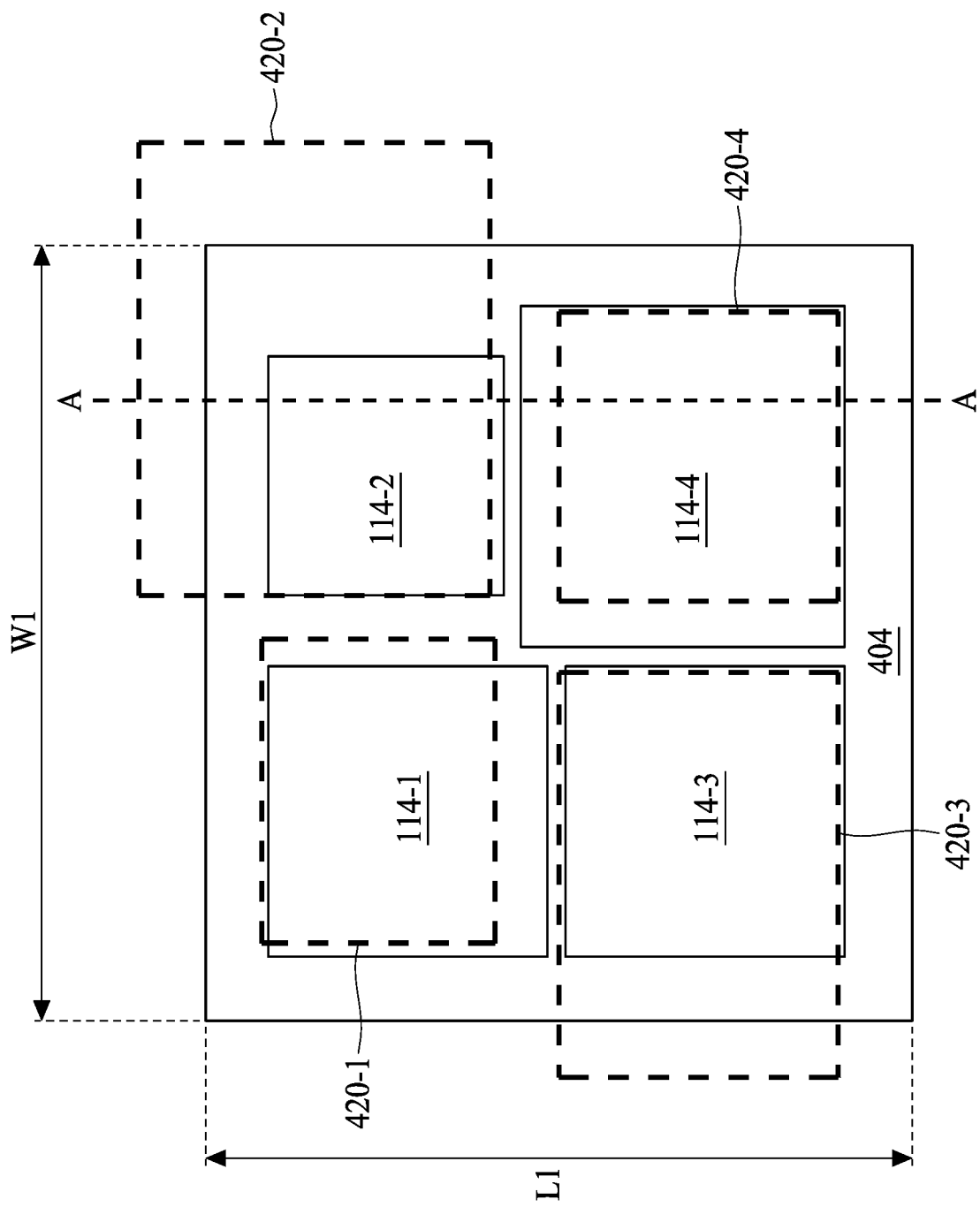

In FIGS. 25A and 25B, sensors 420 are attached to the substrate 402 and the package 200. FIG. 25B is a top view of the structure in FIG. 25A with the structure in FIG. 25A being along line A-A of FIG. 25B. As illustrated in FIG. 25B, there are four sensors 420 (420-1, 420-2, 420-3, and 420-4) that are attached to the structure including the package 200 and the substrate 402, and in other embodiments, more or less sensors may be attached to the structure including the package 200 and the substrate 402. In some embodiments, the recess 404 has a length L1 and a width W1. In some embodiments, the length L1 is in a range from about 5 millimeters (mm) to about 10 mm, such as about 7.6 mm. In some embodiments, the width W1 is in a range from about 5 mm to about 10 mm, such as about 8 mm.

Also illustrated in FIG. 25B, the sensors 420 may be different sizes such that they cover different amounts of area over the recess 404 and the substrate 402, and, in other embodiments, the sensors 420 may be the same size. As illustrated in Figure 25A, the sensors 420 may have different heights H3 and H4, and, in other embodiments, the sensors 420 may have same heights. In some embodiments, the height H3 of the sensor 420-2 is in a range from about 80% to about 120% of the thickness H1 of the substrate H1, such as about 90% of the thickness H1. In some embodiments, the height H4 of the sensor 420-4 is in a range from about 80% to about 120% of the thickness H1 of the substrate H1, such as about 110% of the thickness H1.

Further illustrated in FIGS. 25B, at least one of the sensors 420 can be attached to both the package 200 and the substrate 402 (see 420-2 and 420-3 in FIG. 25B and 420-2 in FIG. 25A). These sensors can "bridge" the package 200 and the substrate 402. The sensors that "bridge" the package 200 and the substrate 402 extend beyond the lateral boundary of the first package 200 and the recess 404 (see FIGS. 25A and 25B) in a plane parallel to the back sides of the integrated circuit dies 114. In addition, at least one sensor 420 can be attached only to the package 200 (see 420-1 and 420-4) and at least one sensor can only be attached only to the substrate 402.

The sensors 420 may include a heart rate monitor, an ambient light sensor, an ultraviolet light sensor, an ambient temperature sensor, an accelerometer, a gyroscope, a magnetometer, a barometric pressure sensor, an oxymetry sensor, a global positioning system (GPS) sensor, a skin conductance sensor (sometimes referred to as a galvanic skin response sensor), a skin temperature sensor, a blood-glucose monitor, the like, or a combination thereof.

The sensors 420 are coupled to the substrate 402 and the package 200 by conductive connectors 424, contact areas 422, contact areas 410, and the pads 162. The conductive connectors 424 may be similar to the conductive connectors 408 described above and the description is not repeated herein although the conductive connectors 408 and 424 need not be the same. In some embodiments, the contact areas 422 and 410 are bond pads. The bond pads 410 and 422 may be similar to the bond pads 406 described and the description is not repeated herein although the bond pads 406, 410, and 422 need not be the same.

By embedding the package 200 within the recess 404 of the substrate 402, the number of sensors 420 and the size of the sensors 420 can be increased. This allows for greater flexibility in the configuration and design of the package structure. For example, this package structure allows for a total sensor area (e.g., total surface area in top view of the substrate 402 including recess 404 covered by sensors 420) that is larger than the area of the package 200 (e.g., total surface area in top view of the substrate 402 including recess 404 covered by the package 200).

FIGS. 26, 27A-B, 28 through 32, and 33A-B are views of intermediate steps during a process for forming a package structure in accordance with another embodiment. FIGS. 26, 27A, 28 through 32, and 33A are cross-sectional views with FIGS. 27B and EEB being top views. This embodiment is similar to the previous embodiment of FIGS. 1 through 3, 4A-B, 5 through 24, and 25A-B except that in this embodiment, the package 200 (e.g., the InFO package 200) is electrically coupled to the substrate 402 by a conductive element (see 430 in FIG. 33A) instead of conductive connectors (see 408 in FIG. 25A). Further, in this embodiment, the through vias 112 in the package 200 may be omitted. Details regarding this embodiment that are similar to those for the previously described embodiment will not be repeated herein.

Figure 26:
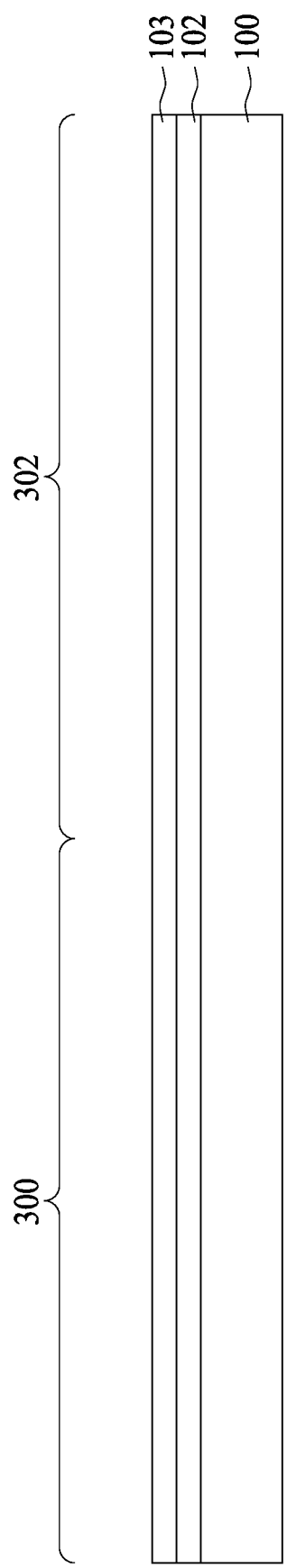
FIGS. 26, 27A-B, 28 through 32, and 33A-B are views of intermediate steps during a process for forming a package structure in accordance with another embodiment.

In FIG. 26, the carrier substrate 100 includes the release layer 102 over the carrier substrate with an adhesive 103 over the release layer 102. The carrier substrate 100 and the release layer 102 were previously described and the descriptions are not repeated herein. The adhesive 103 is formed over the release layer 102 and may be any suitable adhesive, epoxy, die attach film (DAF), or the like.

Figure 27A:
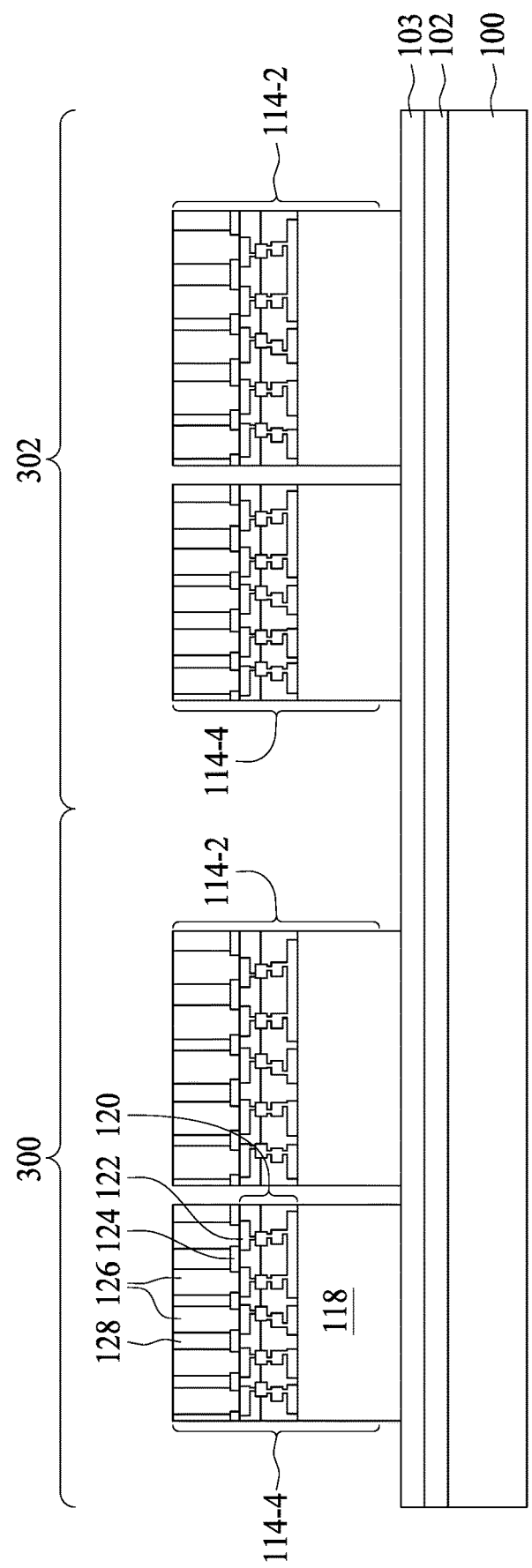
Figure 27B:
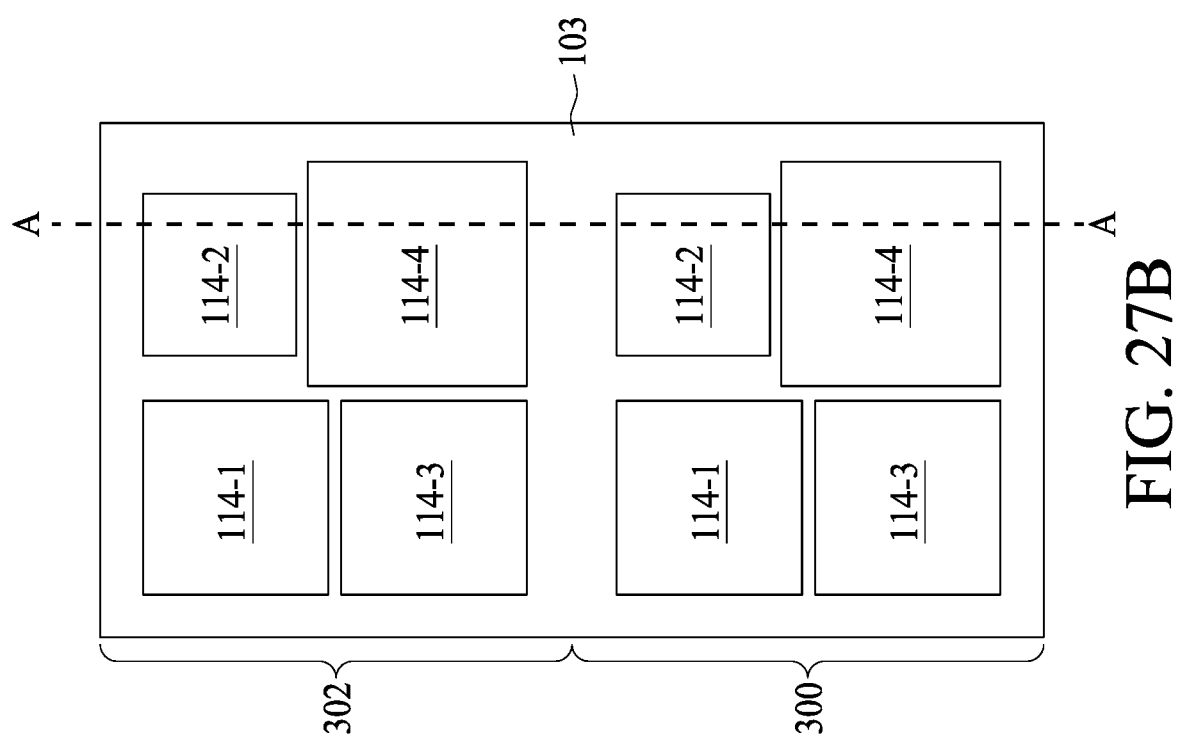

In FIGS. 27A and 27B, integrated circuit dies 114 are placed on the adhesive 103. FIG. 27B is a top view of the structure in FIG. 27A with the structure in FIG. 27A being along line A-A of FIG. 27B. In some embodiments, another adhesive (not shown) may be applied to the back side of the integrated circuit dies 114, such as to a back side of the respective semiconductor wafer (see 116 in FIG. 4A). The integrated circuit dies 114 may be singulated, such as by sawing or dicing, and placed using, for example, a pick-and-place tool.

As illustrated in FIG. 27B, four integrated circuit dies 114 (114-1, 114-2, 114-3, and 114-4) are adhered in each of the first package region 300 and the second package region 302, and in other embodiments, more or less integrated circuit dies may be adhered in each region. Also illustrated in FIG. 27B, the integrated circuit dies 114 may be different sizes, an in other embodiments, the integrated circuit dies 114 may be the same size. The integrated circuit dies 114 were previously described and the descriptions are not repeated herein.

Figure 28:
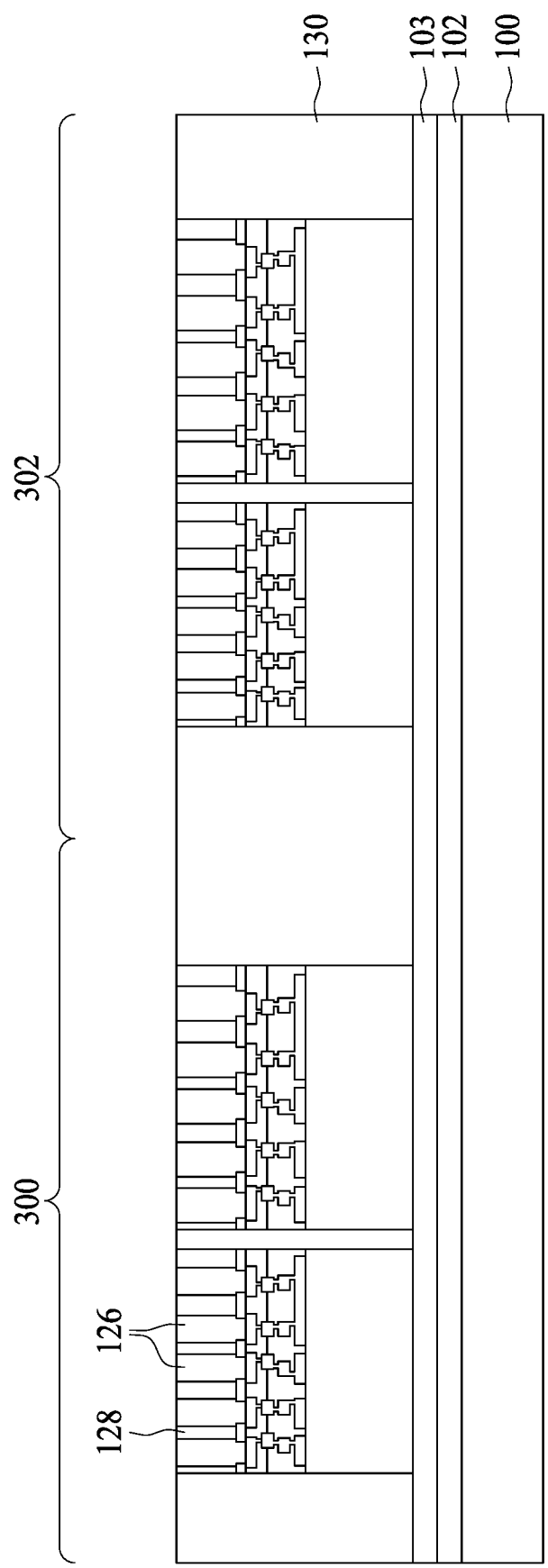

In FIG. 28, encapsulant 130 is formed on the various components. The encapsulant 130 may be a molding compound, epoxy, or the like, and may be applied by compression molding, transfer molding, or the like. After curing, the encapsulant 130 can undergo a grinding process to expose the die connectors 126. Top surfaces of the die connectors 126 and the encapsulant 130 are co-planar after the grinding process. In some embodiments, the grinding may be omitted, for example, if the die connectors 126 are already exposed.

Figure 29:
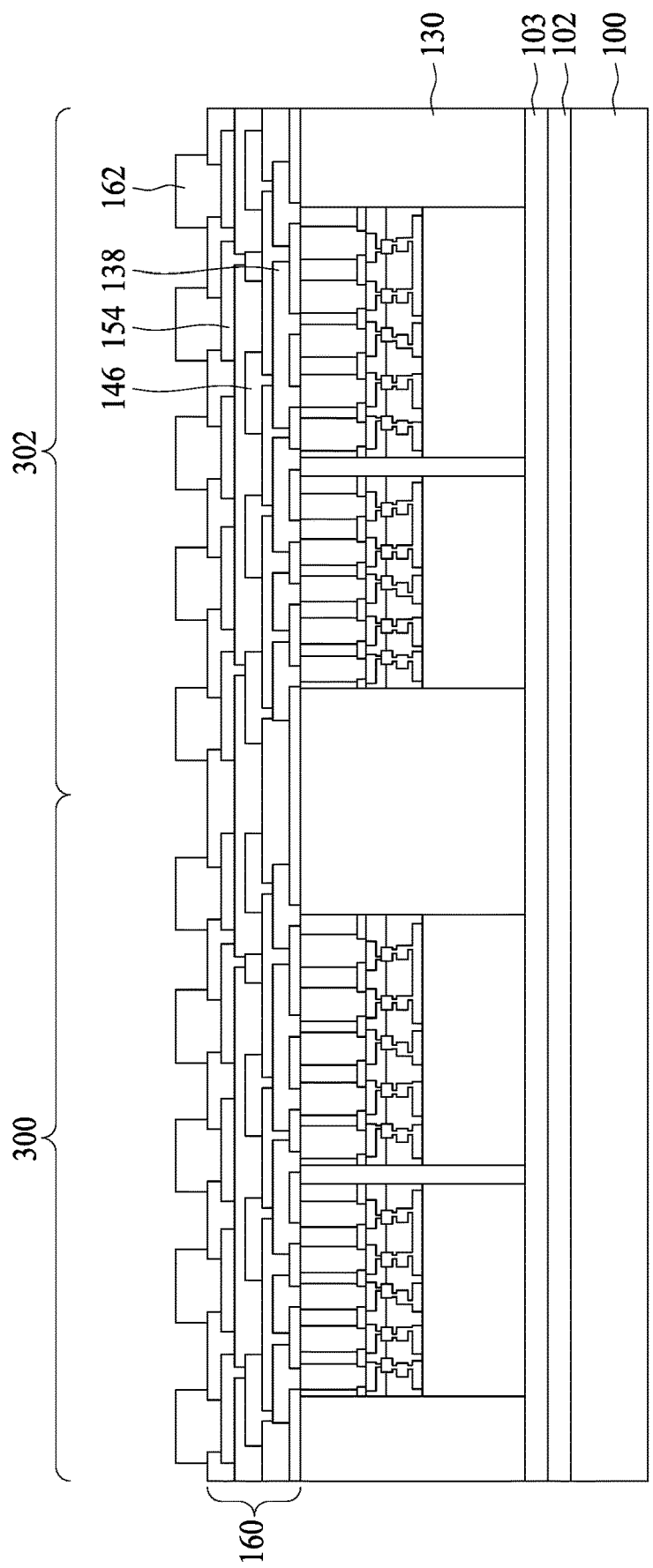

In FIG. 29, the front side redistribution structure 160 is formed over the integrated circuit dies 114 and the encapsulant 130. The metallization patterns 138, 146, and 154 and pads 162 of the front side redistribution structure 160 are electrically coupled to the integrated circuit dies 114 through the die connectors 126. The formation of the front side redistribution structure 160 was previously described in FIGS. 6 through 16 and the description is not repeated herein.

Figure 30:
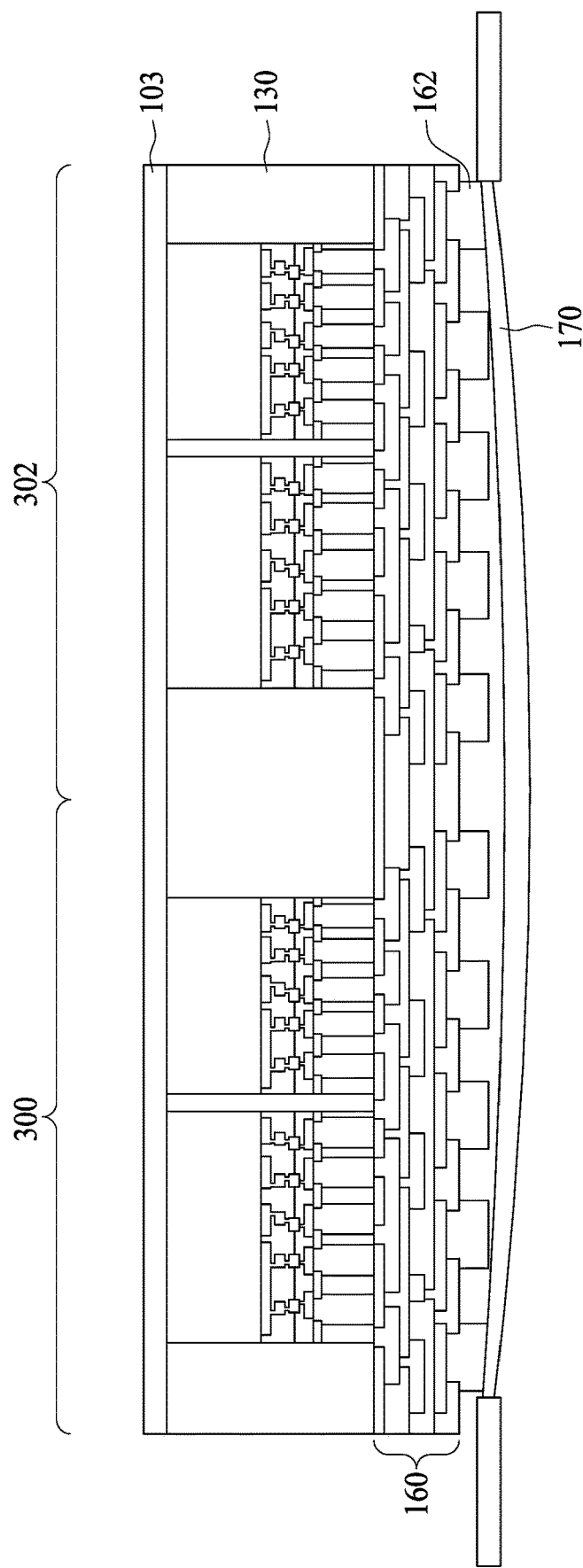

In FIG. 30, a carrier substrate de-bonding is performed to detach (de-bond) the carrier substrate 100 from the backside of the integrated circuit die 114 structure, e.g., the adhesive 103. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on the tape 170.

Figure 31:
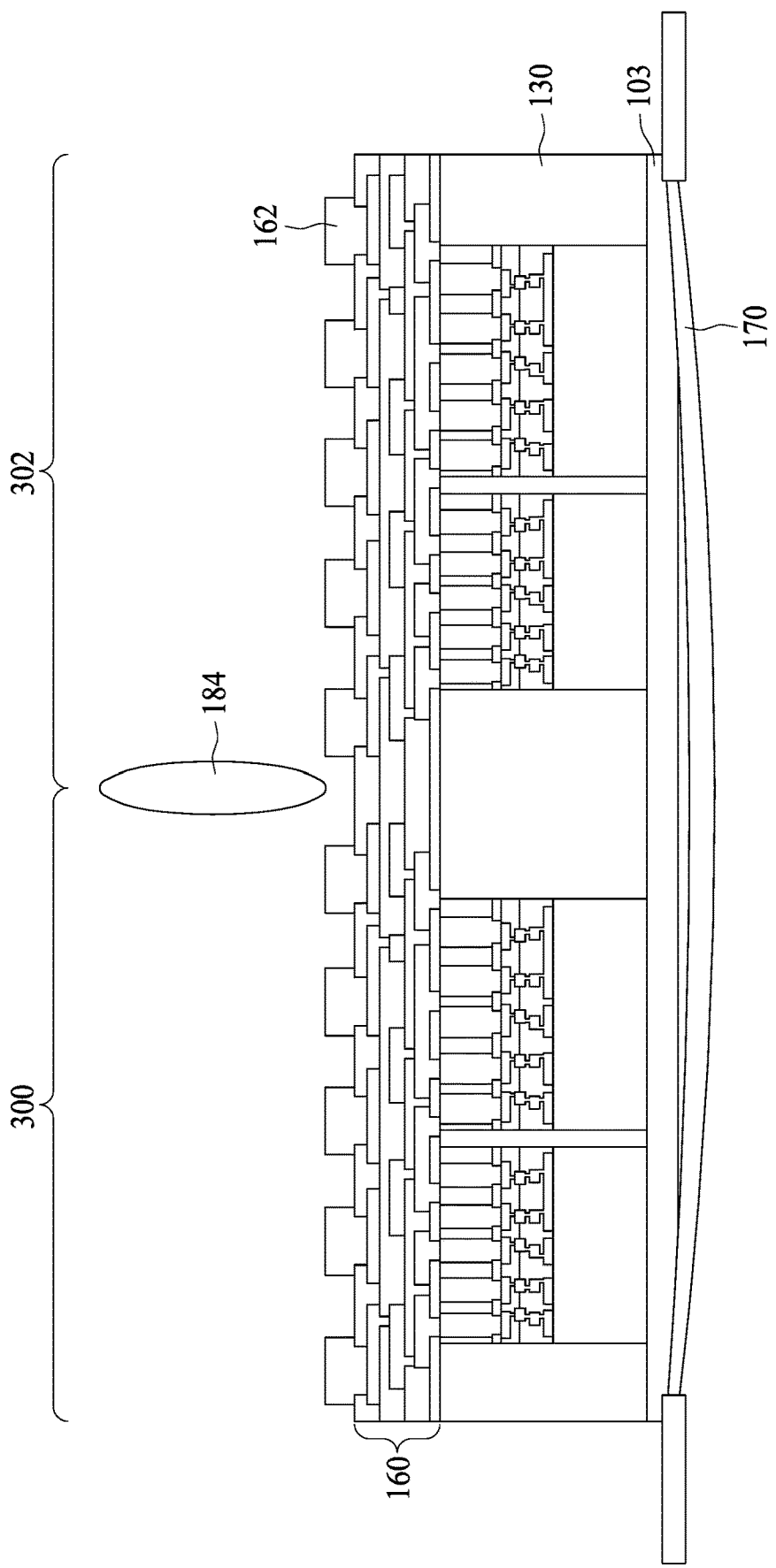
Figure 32:
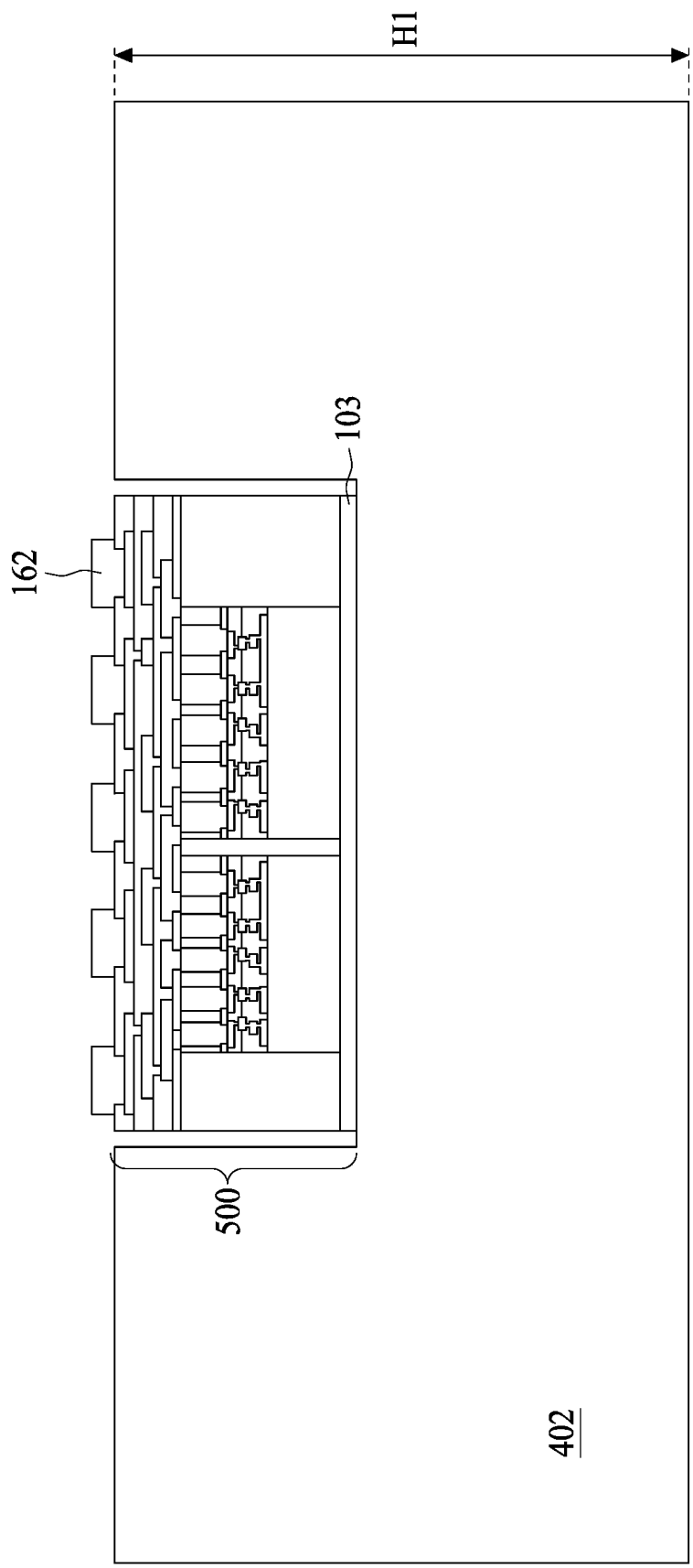

In FIG. 31, a singulation process is performed by sawing 184 along scribe line regions e.g., between adjacent regions 300 and 302. The sawing 184 singulates the first package region 300 from the second package region 302. FIG. 32 illustrates a resulting, singulated structure. The singulation results in package 500, which may be from one of the first package region 300 or the second package region 302, being singulated. The package 500 may also be referred to as an InFO package 500.

Further in FIG. 32, the package 500 is placed within the recess 404 of the substrate 402 such that the package 500 is adhered to the substrate 402 with the adhesive 103. In some embodiments, the package 500 is placed within the recess 404 with, for example, a pick-and-place tool. In an embodiment, the surface of the package 500 including the pads 162 may be level with the surface of substrate 402. In some embodiments, the surface of the package 500 including the pads 162 may be above or below the surface of substrate 402.

Figure 33A:
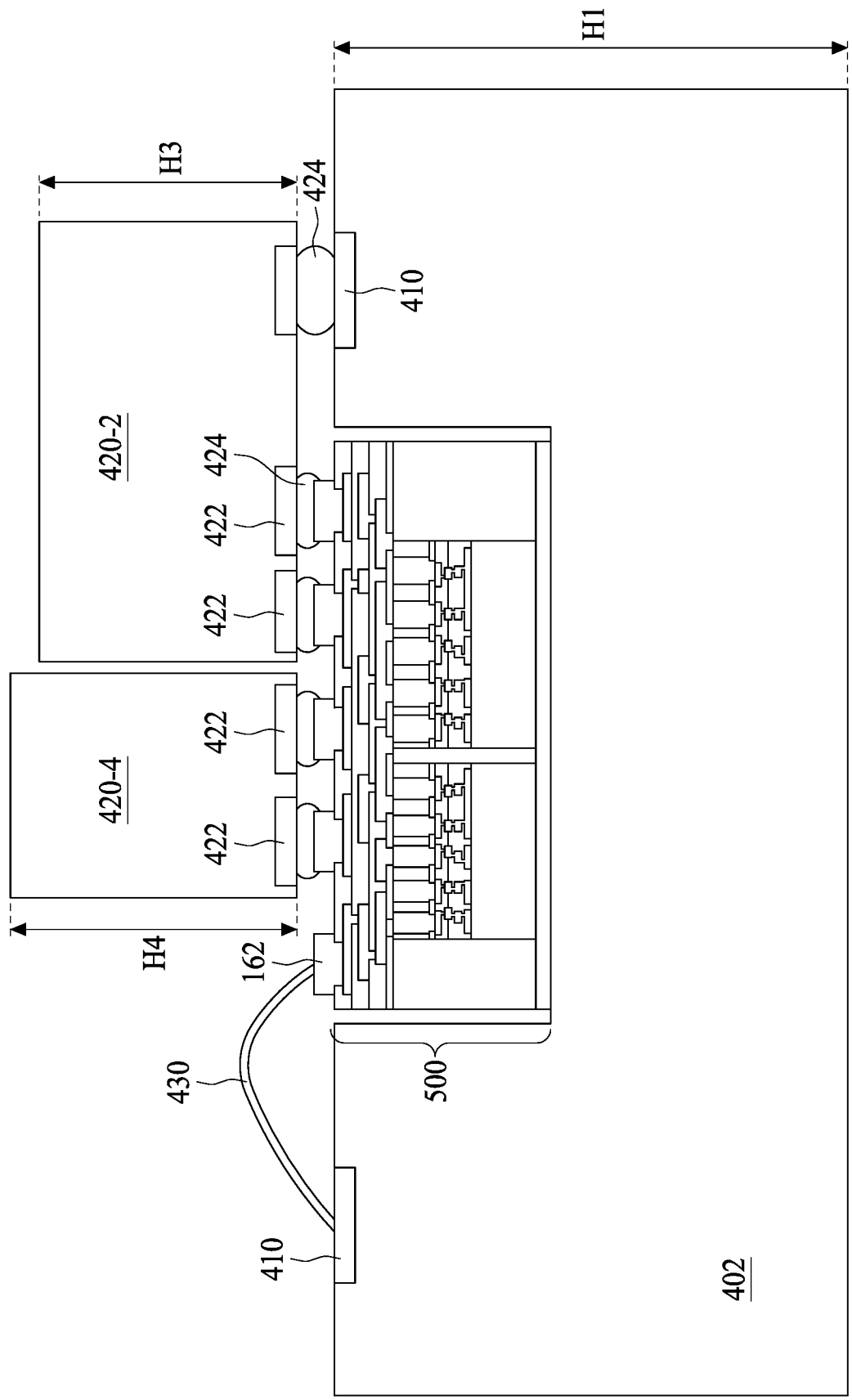
Figure 33B:
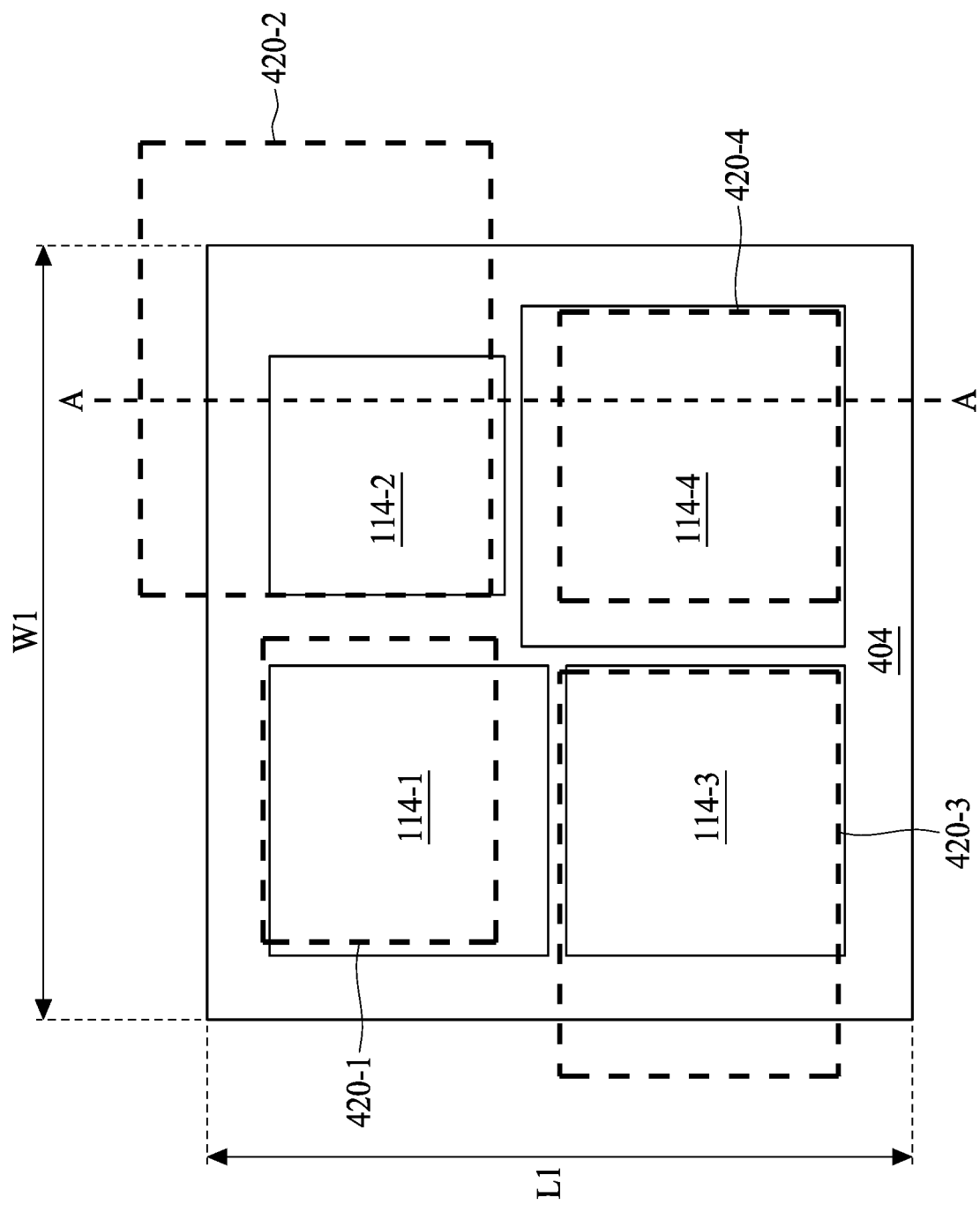

In FIGS. 33A and 33B, sensors 420 are attached to the substrate 402 and the package 200. FIG. 33B is a top view of the structure in FIG. 33A with the structure in FIG. 33A being along line A-A of FIG. 33B. As illustrated in FIG. 33B, there are four sensors 420 (420-1, 420-2, 420-3, and 420-4) that are attached to the structure including the package 500 and the substrate 402, and in other embodiments, more or less sensors may be attached to the structure including the package 500 and the substrate 402. The sensors 420 and the substrate 402 were previously described and the descriptions are not repeated herein.

In this embodiment, there is a conductive element 430 that couples the package 500 to the substrate 402 by way of a pad 162 and a contact area 410. The conductive element 430 allows for the sensors 420 and the package 200 to be electrically coupled with the substrate 402.

As illustrated in FIGS. 33B, at least one of the sensors 420 can be attached to both the package 500 and the substrate 402 (see 420-2 and 420-3 in FIG. 33B and 420-2 in FIG. 33A). These sensors can "bridge" the package 500 and the substrate 402. In addition, at least one sensor 420 can be attached only to the package 200 (see 420-1 and 420-4) and at least one sensor can only be attached only to the substrate 402.

The conductive element 430 may be a conductive wire, a flexible circuit, or the like with one end coupled to the contact area 410 of the substrate 402 and another end coupled to one of the pads 162 of the package 500. In the conductive wire bond embodiment, the conductive element 430 may be formed by forming a ball bond on the contact area 410 and forming a stitch bond on the pad 162 of the package 500.

Figure 34:
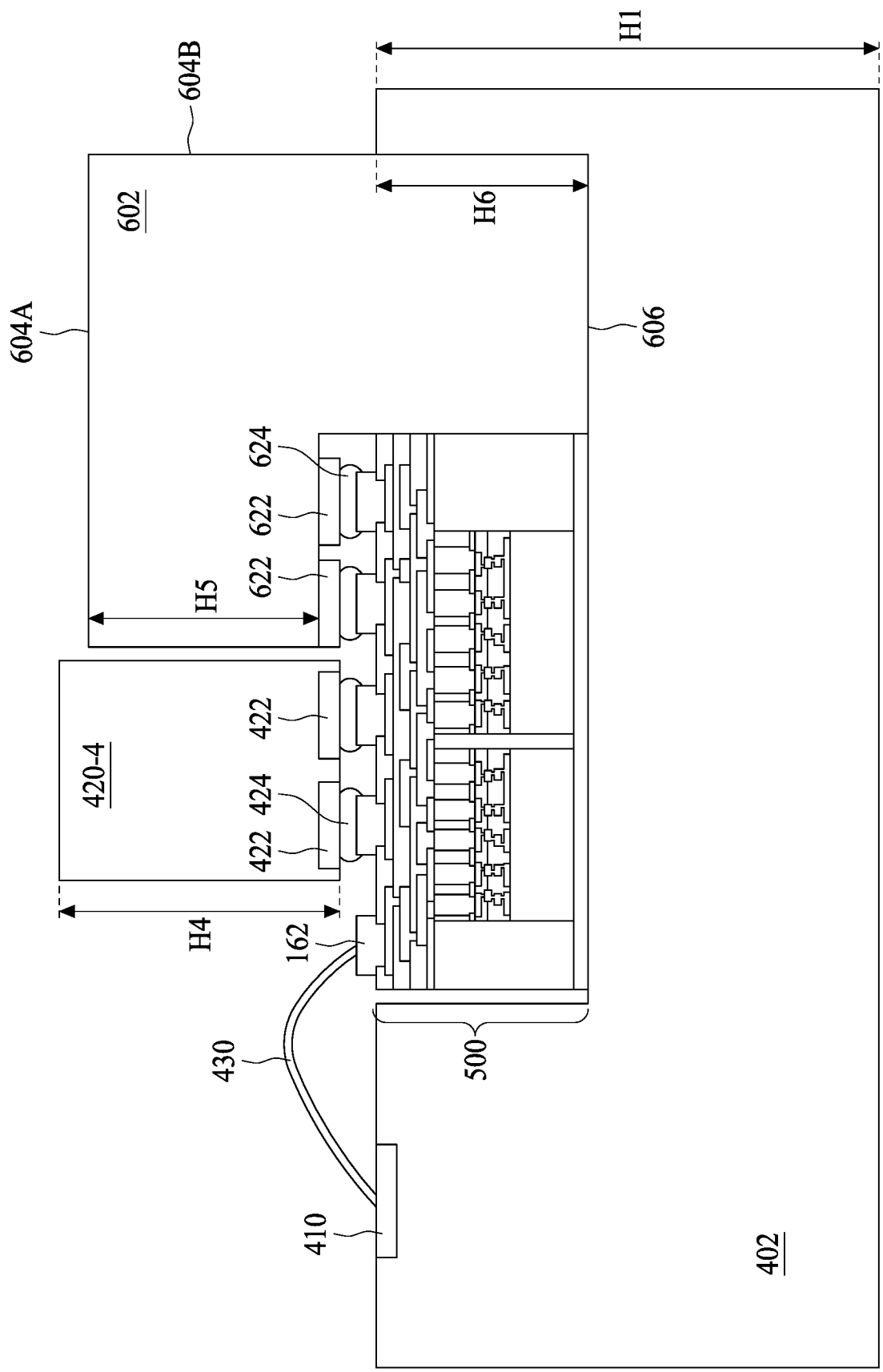
FIG. 34 is a cross sectional view of a package structure in accordance with another embodiment.

FIG. 34 is a cross sectional view of a package structure in accordance with another embodiment. This embodiment is similar to the embodiment in FIGS. 26, 27A-B, 28 through 32, and 33A-B except that this embodiment includes a component 602 coupled to the package 500 and adjoining at least a portion of the substrate 402. Details regarding this embodiment that are similar to those for the previously described embodiment will not be repeated herein.

The component 602 is coupled to the package 500 with contact areas 622 and conductive connectors 624. The contact areas 622 and the conductive connectors 624 may be similar to the to the contact areas 422 and the conductive connectors 424, respectively, described above and the descriptions are not repeated herein although the contact areas 422 and 622 and the conductive connectors 424 and 624 need not be the same.

In an embodiment, the component 602 is a thermoelectric generator (sometimes referred to a thermoelectric generator harvester). In one embodiment where the component 602 is a thermoelectric generator, at least one of the surfaces 604A and 604B is capable of being in direct contact with the skin of a person wearing the device (e.g., a smartwatch) that includes the package structure of FIG. 34 such that the thermoelectric generator 602 can convert the heat from the person into electrical energy to assist in powering the device. For example, in this embodiment, the converted electrical energy can directly power the device, or it can be stored in a battery (not shown) in the device. In another embodiment where the component 602 is a thermoelectric generator, at least the surface 606 is in contact with the substrate 402 and the substrate 402 is capable of being in direct contact with the skin of a person wearing the device that includes the package structure of FIG. 34 such that the heat of the person can be transferred through the substrate 402 to the surface 606 of the thermoelectric generator 602, which can convert the transferred heat into electrical energy to assist in powering the device.

As illustrated in FIG. 34, the component 602 has a height H5 extending over the package 500 and may be embedded within the substrate 402 by a depth H6. In some embodiments, the height H5 is in a range from about 10% to about 40% of the thickness H1 of the substrate H1, such as about 25% of the thickness H1. In some embodiments, the depth H6 is in a range from about 10% to about 40% of the thickness H1 of the substrate H1, such as about 25% of the thickness H1.

By embedding the package 200 within the recess 404 of the substrate 402, the number of sensors 420 and the size of the sensors 420 can be increased. This allows for greater flexibility in the configuration and design of the package structure. For example, this package structure allows for a total sensor area (e.g., total surface area in top view of the substrate 402 including recess 404 covered by sensors 420) that is larger than the area of the package 200 (e.g., total surface area in top view of the substrate 402 including recess 404 covered by the package 200).

An embodiment is a method including placing a first package within a recess of a first substrate. The first package includes a first die. The method further includes attaching a first sensor to the first package and the first substrate. The first sensor is electrically coupled to the first package and the first substrate.

Another embodiment is a method including forming a first package, the forming the first package including at least laterally encapsulating a first die with an encapsulant, the first die having an active side and a back side, the back side being opposite the active side, and forming a first redistribution structure over the first die and the encapsulant, the first redistribution structure being coupled to the active side of the first die. The method further includes coupling the first package to a first substrate, at least a portion of the first package extending within a recess in the first substrate, and bonding a first sensor to the first package and the first substrate, the first sensor being electrically coupled to the first package and the first substrate.

A further embodiment is a device including a first package in a recess of a first substrate, the first package including a first die, and a first sensor electrically coupled to the first package and the first substrate, the first sensor having a first portion directly over the recess of the first substrate and a second portion directly over a portion of the first substrate outside of the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first package in a recess of a first substrate, the first package comprising a first die laterally encapsulated with an encapsulant and a first redistribution structure over the first die and the encapsulant, a top surface of the first substrate extending higher than the encapsulant;
   a first sensor electrically coupled to the first package and the first substrate, the first sensor having a first portion directly over the recess of the first substrate and a second portion directly over a portion of the first substrate outside of the recess, the first sensor spanning across a gap between a sidewall of the recess of the first substrate and an exterior sidewall of the first package;
   a second sensor electrically coupled to the first package, the second sensor being only over the recess of the first substrate; and
   a bond pad in the recess of the first substrate, the first package being bonded to the bond pad in the recess, wherein the first package further comprises a through via extending through the encapsulant from the first redistribution structure adjacent a sidewall the first die to a level of a back side of the first die, a top surface and a bottom surface of the encapsulant being within the recess, a top surface and a bottom surface of the through via being within the recess, the through via of the first package being electrically coupled to the bond pad in the recess of the first substrate and to the first redistribution structure, the top surfaces of the encapsulant and the through via being coplanar.

2. The device of claim 1, wherein the first sensor comprises a heart rate monitor, an ambient light sensor, an ultraviolet light sensor, an ambient temperature sensor, an accelerometer, a gyroscope, a magnetometer, a barometric pressure sensor, an oxymetry sensor, a global positioning system (GPS) sensor, a skin conductance sensor, a skin temperature sensor, a blood-glucose monitor, or a combination thereof.

3. The device of claim 1, wherein the first sensor and the second sensor are bonded to a surface of the first package.

4. The device of claim $_3$, wherein the first sensor is bonded to a surface of the first substrate.

5. The device of claim 1 further comprising:
   a third sensor electrically coupled to the first package and the first substrate, the third sensor having a first portion directly over the recess of the first substrate and a second portion directly over a portion of the first substrate outside of the recess.

6. The device of claim 1 further comprising:
   a second bond pad on a first surface of the first substrate, the first surface being outside of the recess of the first substrate, the first package being electrically coupled to the second bond pad of the first substrate with a conductive connector.

7. The device of claim 6, wherein the conductive connector is a wire bond, and wherein the first sensor is bonded to the first substrate with a solder bump.

8. The device of claim 1 further comprising:
   a thermoelectric generator bonded to the first package and the first substrate, the thermoelectric generator being electrically coupled to the first package.

9. A structure comprising:
   a first bond pad on a bottom surface of a recess of a first substrate;
   a first package bonded to the first bond pad within the recess, the first package comprising:
      a first die laterally encapsulated with an encapsulant, the first die having an active side and a back side, the back side being opposite the active side;
      a first redistribution structure over the first die and the encapsulant, the first redistribution structure being electrically coupled to the active side of the first die; and a through via extending through the encapsulant from the first redistribution structure to a level of the back side of the first die, a topmost surface and a bottommost surface of the encapsulant being within the recess, the through via of the first package being electrically coupled to the first bond pad of the first substrate; and a first sensor bonded to the first package and the first substrate, the first sensor being electrically coupled to the first package and the first substrate.

10. The structure of claim 9 further comprising:
a second sensor electrically coupled to the first package, the second sensor being only over the recess of the first substrate.

11. The structure of claim 9 further comprising:
a third sensor electrically coupled to the first package and the first substrate, the third sensor having a first portion directly over the recess of the first substrate and a second portion directly over a portion of the first substrate outside of the recess.

12. The structure of claim 9, wherein the first sensor is bonded to a surface of the first package and to a surface of the first substrate.

13. The structure of claim 9, wherein the first sensor spans across a gap between a sidewall of the recess of the first substrate and an exterior sidewall of the first package.

14. The structure of claim 9, wherein the first sensor comprises a heart rate monitor, an ambient light sensor, an ultraviolet light sensor, an ambient temperature sensor, an accelerometer, a gyroscope, a magnetometer, a barometric pressure sensor, an oxymetry sensor, a global positioning system (GPS) sensor, a skin conductance sensor, a skin temperature sensor, a blood-glucose monitor, or a combination thereof.

15. A device comprising:
a first package within a recess in a first substrate, the first package comprising:
a first die laterally encapsulated with an encapsulant, the first die having an active side and a back side, the back side being opposite the active side; and
a first redistribution structure over the first die and the encapsulant, the first redistribution structure being electrically coupled to the active side of the first die, a top surface of the first substrate extending higher than the encapsulant;
a through via extending through the encapsulant from the first redistribution structure to a level of the back side of the first die, the through via of the being electrically coupled to the first substrate through a bond pad in the recess of the first substrate, the through via being adjacent a sidewall of the first die and separated from the sidewall of the first die by the encapsulant;
a first sensor bonded to the first package and the first substrate, the first sensor being electrically coupled to the first package and the first substrate, the first sensor comprises a first portion directly over the recess of the first substrate and a second portion directly over a portion of the first substrate outside of the recess, the first sensor spans across a gap between a sidewall of the recess of the first substrate and an exterior sidewall of the first package; and
a second sensor bonded to the first package, the second sensor being electrically coupled to the first package.

16. The device of claim 15, wherein the second sensor is only directly over the recess of the first substrate.

17. The device of claim 15 further comprising:
a thermoelectric generator bonded to the first package and the first substrate, the thermoelectric generator being electrically coupled to the first package.

18. The device of claim 15, wherein a topmost surface and a bottommost surface of the encapsulant is within the recess.

19. The device of claim 15, wherein a topmost surface and a bottommost surface of the through via is within the recess.

20. The device of claim 15, wherein the first sensor comprises a heart rate monitor, an ambient light sensor, an ultraviolet light sensor, an ambient temperature sensor, an accelerometer, a gyroscope, a magnetometer, a barometric pressure sensor, an oxymetry sensor, a global positioning system (GPS) sensor, a skin conductance sensor, a skin temperature sensor, a blood-glucose monitor, or a combination thereof.

* * * * *

UNITED STATES PATENT AND TRADEMARK OFFICE
CERTIFICATE OF CORRECTION

PATENT NO. : 10,937,718 B2
APPLICATION NO. : 15/882360
DATED : March 2, 2021
INVENTOR(S) : Yu et al.

Page 1 of 1

It is certified that error appears in the above-identified patent and that said Letters Patent is hereby corrected as shown below:

In the Claims

In Column 16, Line 35, Claim 4, delete "claim$_3$" and insert --claim 3--.

Signed and Sealed this
Sixth Day of July, 2021

Drew Hirshfeld
*Performing the Functions and Duties of the*
*Under Secretary of Commerce for Intellectual Property and*
*Director of the United States Patent and Trademark Office*